(12) United States Patent  
McBain et al.

(10) Patent No.: US 7,515,416 B2  
(45) Date of Patent: Apr. 7, 2009

(54) STRUCTURES FOR HOLDING CARDS INCORPORATING ELECTRONIC AND/OR MICROMACHINED COMPONENTS

(76) Inventors: Richard Austin McBain, 14309 - 86th Avenue, Surrey, BC (CA) V3W 0N9; David Arthur Hicks, 5840 Broadway Street, Burnaby, BC (CA) V5B 2X9; Cory Frederick Padula, 7432 Leary Crescent, Chilliwack, BC (CA) V2R 3H4

( * ) Notice: Subject to any disclaimer, the term of this patent is extended or adjusted under 35 U.S.C. 154(b) by 0 days.

(21) Appl. No.: 11/685,125

(22) Filed: Mar. 12, 2007

(65) Prior Publication Data

US 2007/0258216 A1 Nov. 8, 2007

Related U.S. Application Data

(63) Continuation of application No. PCT/CA2005/001410, filed on Sep. 13, 2005.

(60) Provisional application No. 60/609,004, filed on Sep. 13, 2004.

(51) Int. Cl.
- H05K 7/20 (2006.01)
- H01L 23/34 (2006.01)
- F28F 7/00 (2006.01)

(52) U.S. Cl. .............. 361/699; 361/702; 165/80.5; 165/104.33; 174/15.1; 257/714

(58) Field of Classification Search .......... 361/698, 361/699, 701, 702; 257/714; 165/80.4, 80.5, 165/104.33; 174/15.1, 15.2, 252
See application file for complete search history.

(56) References Cited

U.S. PATENT DOCUMENTS

| | | | | |
|---|---|---|---|---|
| 3,956,673 A * | 5/1976 | Seid | ............................ | 361/690 |
| 4,186,422 A * | 1/1980 | Laermer | ...................... | 361/689 |
| 4,777,561 A | 10/1988 | Murphy et al. | | |
| 4,829,402 A * | 5/1989 | Gewebler et al. | ........... | 361/692 |
| 4,958,257 A * | 9/1990 | Wenke | ......................... | 361/700 |
| 5,420,753 A * | 5/1995 | Akamatsu et al. | ........... | 361/719 |
| 5,424,916 A | 6/1995 | Martin | | |
| 5,825,621 A | 10/1998 | Giannatto et al. | | |
| 5,835,349 A | 11/1998 | Giannatto et al. | | |
| 5,982,619 A | 11/1999 | Giannatto et al. | | |
| 6,026,565 A | 2/2000 | Giannatto et al. | | |
| 6,052,284 A * | 4/2000 | Suga et al. | ................... | 361/699 |
| 6,052,285 A * | 4/2000 | Hileman | ....................... | 361/699 |
| 6,545,877 B1 * | 4/2003 | Agha et al. | .................. | 361/801 |
| 7,324,336 B2 * | 1/2008 | Vos et al. | ..................... | 361/694 |

* cited by examiner

*Primary Examiner*—Jayprakash N Gandhi  
*Assistant Examiner*—Zachary M Pape  
(74) *Attorney, Agent, or Firm*—Oyen, Wiggs, Green & Mutala LLP

(57) ABSTRACT

This invention provides a structure for holding cards having electronic and/or micromachined components. A chassis comprises a plurality of bays for receiving cards such that the cards are oriented parallel to one another. Each bay comprises a fin front-plate fabricated from thermally-conductive material(s). Each fin front-plate is coupled to or integrally formed with a base in a manner which permits thermal conductivity therebetween. For each bay holding a card, a backplane comprises an electrical connector for coupling to the card. When held in their respective bays, cards are thermally coupled to the fin front-plates. The base of the chassis preferably comprises an ingress port, an egress port and a network of conduits for conducting fluid which cools and/or redistributes heat created by the cards and their components. The network of conduits may extend from the base and into the fin front-plates.

45 Claims, 14 Drawing Sheets

STRUCTURES FOR HOLDING CARDS INCORPORATING ELECTRONIC AND/OR MICROMACHINED COMPONENTS

RELATED APPLICATION

This application is a continuation of PCT/CA2005/001410 filed 13 Sep. 2005, which itself claims priority from U.S. application No. 60/609,004 filed 13 Sep. 2004.

TECHNICAL FIELD

The invention relates to devices which include electronic and/or micromachined components. Particular embodiments of the invention provide structures for holding cards which incorporate electronic and/or micromachined components.

BACKGROUND

Electronic and/or micromachined components are often provided on cards. Cards incorporating electronic and/or micromachined components may comprise without limitation: semiconductor components (wherein one or more electronic or micromachined components are fabricated on a semiconductor substrate); discrete electronic and/or electromechanical components; and printed circuit boards (PCB's) which may themselves support semiconductor and/or discrete components. Non-limiting examples of cards having electronic components include: cards complying with the Peripheral Component Interconnect (PCI) bussed communication standard which are prevalent on many desktop computers; cards complying with the CardBus™ PC Card standard developed by the Personal Computer Memory Card International Association (PCMCIA) which are common in many laptop computers; cards complying with the ExpressCard™ standard and application-specific cards which may be designed for specific embedded systems applications for example.

In various applications, it is desirable that cards incorporating electronic and/or micromachined components be held in structures that are compact (e.g. for operating in spatially confined environments), robust (e.g. for operating in environments that are subject to adverse conditions, such as temperature extremes, pressure extremes, radiation, physical jostling or contact, vibration, electromagnetic interference, electrostatic discharge, moisture, corrosion and the like); and reliable, for error free operation over a relatively long lifetime.

The electronic and/or micromachined components present on cards typically consume energy as they operate. The energy consumption associated with these components commonly results in a release of heat. Excessive temperatures may damage the cards and/or their components. The amount of heat generated by a card depends on many factors, including, for example, the operational frequency, size and current load of the electronic components on the card. Typically, cards incorporating components operating at higher power levels tend to generate more heat energy. The desirability for compact card holding structures compounds the difficulties associated with heat management, as heat from closely packed cards can significantly raise the temperature of the environment surrounding the cards and can even directly heat adjacent cards. There is a general desire to provide card holding structures which incorporate mechanisms for removing heat from such cards or for otherwise managing the heat associated with such cards in a manner which prevents damage to the cards and/or their components.

In many applications, it is desirable for cards incorporating electronic and/or micromachined components to interact with other systems and/or components. For example, cards incorporating electronic and/or micromachined components are frequently required to interact with external electronic systems, mechanical systems, pneumatic/hydraulic systems, fluid control systems, wired and wireless communications systems, sensors, actuators or the like. In order to interact with other systems and/or components, cards must be operably connected with such systems and/or components. Typically, such operable connections are electronic in nature, but they may also include wireless connections, optical connections, mechanical connections, fluid connections, hydraulic/pneumatic connections, magnetic connections or the like. The desirability of allowing cards to interact with external components and systems can exacerbate the difficulties associated with providing card holding structures which are compact, robust and reliable and which can effectively manage heat dissipation.

BRIEF DESCRIPTION OF THE DRAWINGS

In drawings which depict non-limiting embodiments of the invention.

DETAILED DESCRIPTION

Figure 1A:
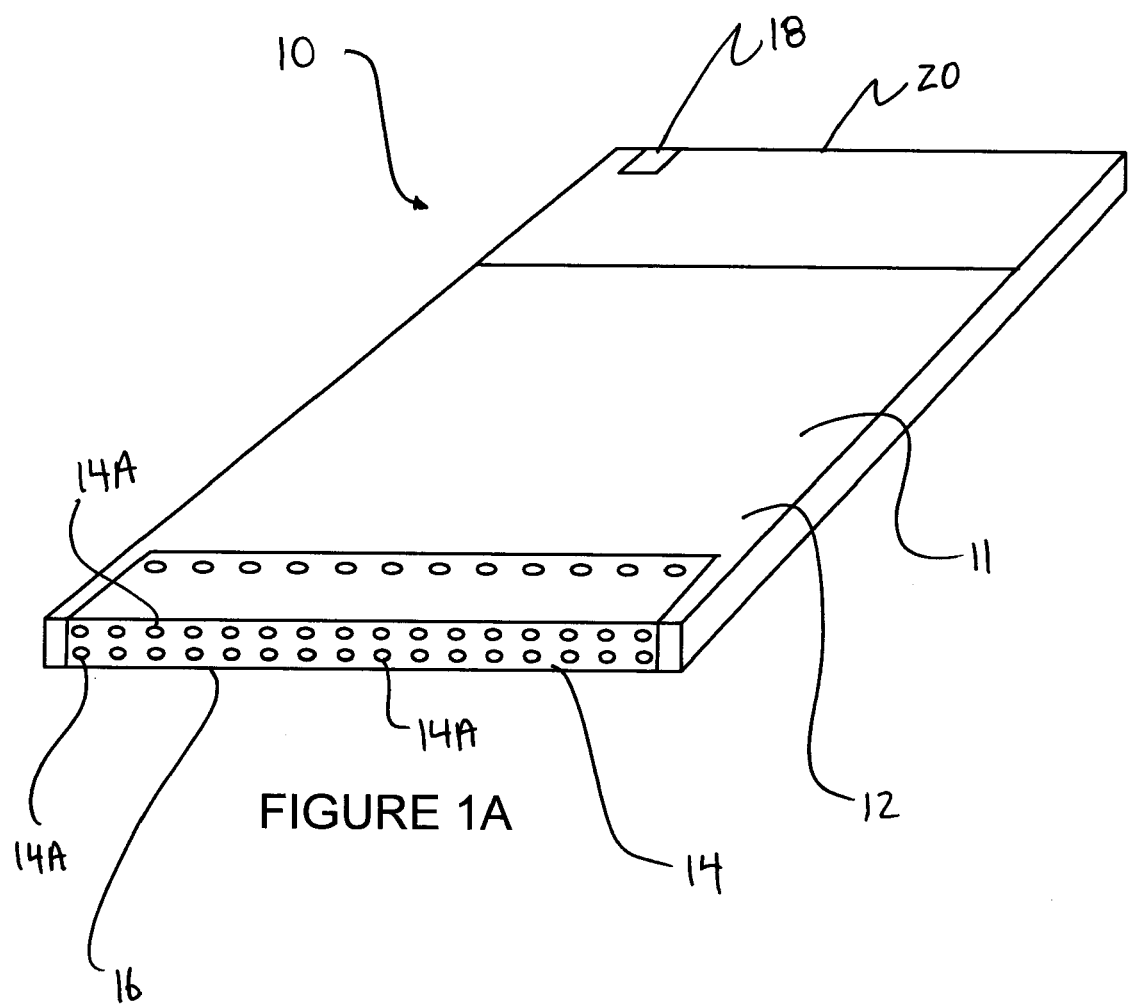
FIG. 1A is an isometric view of an off-the-shelf card for holding electronic and/or micromachined components of the type that may be held in the structures of the present invention.

Throughout the following description, specific details are set forth in order to provide a more thorough understanding of the invention. However, the invention may be practiced without these particulars. In other instances, well known elements have not been shown or described in detail to avoid unnecessarily obscuring the invention. Accordingly, the specification and drawings are to be regarded in an illustrative, rather than a restrictive, sense.

One aspect of the invention provides a structure for housing cards which incorporate electronic components. The structure comprises: a thermally-conductive base the base that defines a plurality of slots which extend from a first side of the base to a second side of the base; a plurality of thermally-conductive fin front-plates located adjacent the slots in thermal contact with, and extending away from, the first side of the base; and one or more cooling fluid conduits located in the base for conducting cooling fluid into the base via an ingress port, through the base and out of the base via an egress port. The structure defines a plurality of bays, wherein each bay is dimensioned to hold a card with the card extending from the first side of the base through a corresponding one of the slots for operable connection to a backplane located on the second side of the base and with a front surface of a shroud of the card in thermal contact with a contact surface of a corresponding one of the fin front-plates to provide a thermal conduction path from the shroud to the fin front-plate and from the fin front-plate to the base.

Another aspect of the invention provides a structure for housing cards which incorporate electronic components. The structure comprises a thermally-conductive base that defines a plurality of slots which extend from a first side of the base to a second side of the base; one or more cooling fluid conduits located in the base for conducting cooling fluid into the base via an ingress port, through the base and out of the base via an egress port; a plurality of fin front-plates located adjacent the slots that extend from the first side of the base in a direction away from the first side of the base; and, for each fin front plate, one or more front fin conduits having conduit walls in contact with the fin front-plate and in fluid communication with the one or more cooling fluid conduits in the base. The structure defines a plurality of bays, wherein each bay is dimensioned to hold a card with the card extending from the first side of the base through a corresponding one of the slots for operable connection to a backplane located on the second side of the base and with a front surface of a shroud of the card in thermal contact with a contact surface of a corresponding one of the fin front-plates.

Another aspect of the present invention provides a structure for holding cards which incorporate electronic and/or micromachined components. The structure provides a chassis comprising a base and a plurality of bays for receiving and holding corresponding cards. Cards held in the bays are preferably oriented parallel to one another to provide a close packing arrangement. The bays may be substantially the same size or may be different sizes. Each bay is defined on one side by a fin front-plate fabricated from thermally-conductive material(s). The fin front-plates are coupled to the base in a manner which provides low impedance thermal conductivity. In preferred embodiments, each fin front-plate is integrally formed with the base. Integral formation of the fins and the base can provide a combination of excellent chassis strength together with excellent heat conduction characteristics in a monolithic unit.

Each of the cards held in the structure may project through a slot from a first side of the base for operable connection to a backplane located on the opposing side of the base. The backplane may comprise connectors for operatively coupling to corresponding connectors on the cards. Connectors between the backplane and the cards are not limited to electronic connectors and may comprise optical connections, mechanical connections, fluid conduits, pneumatic/hydraulic connections or the like. The backplane may comprise its own electronic, micromachined, optical, mechanical and/or hydraulic/pneumatic component(s) which permit interaction between cards and/or external systems.

Each of the cards may comprise a shroud in which its electronic and/or micromachined components are encased. Preferably, the shroud is fabricated from thermally-conductive material(s). Any space which may be present between the card's electronic and/or micromachined components and the interior surface of the shroud may be filled with thermally-conductive material for providing a low impedance thermal conduction path between the card components and the shroud. One of the surfaces (i.e. a front surface) of the shroud of each card held in the structure abuts against a surface of its corresponding fin front-plate to provide a low impedance thermal conduction path from the components on the card to the shroud, from the shroud to the fin front-plate and from the fin front-plate to the base.

In some embodiments, the front surface of the shroud (i.e. the surface that abuts against the fin front-plate) is one of two large flat surfaces of the shroud (i.e. in surface area). These two surfaces may be the two largest flat surfaces of the shroud. Providing a large contact surface between the shroud and the fin front-plate helps to maximize the heat transfer between the shroud and the fin front-plate. In some embodiments at least 50% of the surface area of the shroud front surface directly abuts against the fin front-plate. In preferred embodiments, more that 60% of the surface area of the shroud front surface directly abuts against the fin front-plate. In particularly preferred embodiments, more that 70% of the surface area of the shroud front surface directly abuts against the fin front-plate.

In some embodiments, the ratio of contact area (between the shroud front surface and the fin front-plate) to card power consumption is less than 625 $mm^2$/W. In particular embodiments, the ratio of contact area (between the shroud front surface and the fin front-plate) to card power consumption is less than 125 $mm^2$/W. In particularly preferred embodiments, the ratio of contact area (between the shroud front surface and the fin front-plate) to card power consumption is less than 25 $mm^2$/W.

The fin front-plates are preferably oriented substantially parallel to one another and the bays are dimensioned to permit close packing of cards in the structure. In some embodiments, the structures described herein are dimensioned to hold cards of particular standards, such as cards that conform to the Cardbus™ and/or ExpressCard™ standards. Such standardized cards have known dimensions. In some embodiments, the capacity of the structure for heat removal allows the cards to be packed such that the structure has a power density greater than 25 mW/$cm^3$. In preferred embodiments, the power density of the structure can be over 250 mW/$cm^3$.

The abutting relationship between the front surface of the shroud and the fin front-plate also provides structural support for the cards held in the structure. As discussed above, the cards are operably connected to a backplane. In environments where the cards and/or the structure holding the cards is subject to mechanical contact, movement (e.g. jostling) or the like, the structural support rendered by the abutting relationship between the front surface of the shroud and the fin front-plate can help to maintain the operability of the connection between the cards and the backplane.

In some embodiments, fluid conduits are provided on one or more surfaces of the fin front-plates and/or within the body of the fin front-plates. Such fluid conduits may provide a pathway by which cooling fluid (i.e. liquid or gas) flows through the conduits and thereby helps to dissipate heat from the fin-front plates. In such embodiments, a high degree of thermal conductivity between the fin front-plates and the base may not be necessary, as the bulk of the heat from the cards and their components may be dissipated from the fin front-plates by the cooling fluid. In general, however, heat dissipation from the fin front-plates to the base may occur by a combination of direct thermal transmission from the fin front-plates to the base and/or via the cooling fluid which travels into the fin front-plates and from the fin front-plates to the base.

In some embodiments, each fin front-plate has at least one flat surface for abutting against the front surface of a corresponding shroud. Other surface(s) of the fin front-plate may also be flat or may alternatively have a non-flat profile for maximizing their surface areas and their ability to dissipate heat. In some embodiments, the cards are held in abutting relationship with their corresponding fin front-plates by fin back-plates. Each fin back-plate abuts against a surface of the shroud (i.e. a back surface) that is opposite to the front shroud surface which abuts against the fin front-plate. Preferably, the back surface of the shroud (against which the fin back-plate abuts) is the other one of the two large flat surfaces of the shroud.

Each fin back-plate may be releasably fastened to its corresponding fin front-plate to secure its corresponding card between the fin back-plate and the fin front-plate. The fin back-plates may provide additional paths for heat dissipation from their corresponding cards. Such heat may flow from the cards and their components to the back surfaces of the shrouds, to the fin back-plates and then either to the external environment or, if there is a thermal conduction path, to the base. The fin back-plates may also provide additional structural support to their cards which helps to maintain the operability of the connection between their cards and the backplane.

In some embodiments, fluid conduits are provided on one or more surfaces of the fin back-plates and/or within the body of the fin back-plates to conduct cooling fluid and to thereby dissipate heat in a manner similar to that discussed above for the fin front-plates. In some embodiments, each fin back-plate has at least one flat surface for abutting against the back surface of its corresponding shroud. The other surface of the fin back-plate may also be flat or may alternatively have a non-flat profile for maximizing its surface area and its ability to dissipate heat. In preferred embodiments, more than 50% of the back shroud surface is in contact with the fin back-plate.

The base of the chassis preferably comprises an ingress port, an egress port and a network of conduits for conducting cooling fluid. The conduction of cooling fluid through the base helps to redistribute heat created by the cards and their components and may be used to dissipate heat from the cards and their component and/or to regulate the temperature of the cards and their components. The network of conduits may extend from the base into the fin front-plates and fin-back plates as discussed above. In some embodiments, fluid is cooled by an external cooling system prior to entering the ingress port, is warmed as it travels through the network of conduits and helps to dissipate heat from the cards, and then exits the egress port, where it is conducted to the external cooling system to be cooled again.

The heat dissipated in such external cooling systems may be used by other external systems for other applications requiring energy, such as heating an external environment for example. In some embodiments, the conduits in the base form part of an active temperature control system, wherein one or more temperature feedback sensors are provided on the base, the backplane, one or more fin front-plates, one or more fin back-plates and/or one or more cards and a controller uses information from the temperature feedback sensor(s) to control one or more actuators in a manner which regulates the temperature of the structure and the cards held therein. Non-limiting examples of actuators suitable for implementing temperature control systems include controllable pneumatic/hydraulic elements, such as valves, pumps, pistons and cylinders, for example.

Cards held in a structure as described herein may be enclosed by a cover which extends over the chassis to cover the base, the bays, the fin front-plates and the cards. The cover may comprise a single integrally formed component or may be fabricated from a plurality of different components, which may include separate sidewalls for example. Preferably, the cover has at least one port for routing electrical connections, optical connections, hydraulic/pneumatic connections, mechanical connections and/or fluid conduits to an external environment. In some embodiments, the enclosure formed between the base and the cover (i.e. where the cards are located) is evacuated, pressurized or filled with a fluid, such as dry air for example. In some embodiments, the cover is fabricated from metallic material(s) which provide some protection from electromagnetic interference. In other embodiments, the cover is fabricated from other materials, such as thermoplastic (e.g. plexiglass™), which permit wireless communication between components in the enclosure and the external environment.

Other aspects of this invention include any and all apparatus comprising a novel and inventive feature, combination of features, and/or subcombination of features as described or clearly inferred from this description. Sill other aspects of this invention include any and all methods comprising a novel and inventive act, combination of acts, subcombination of acts, step, combination of steps and/or subcombination of steps as described or clearly inferred from this description.

Further aspects and specific features and applications of specific embodiments of the invention are described below.

Cards incorporating electronic and/or micromachined components are referred to in this description as "cards". Cards incorporating electronic and/or micromachined components may generally comprise, without limitation: semiconductor components (wherein one or more electronic or micromachined components are fabricated on a semiconductor substrate); discrete electronic and/or electromechanical components; and printed circuit boards (PCB's) which may themselves support one or more semiconductor or discrete components. Cards may be purchased "off-the-shelf" or may be specifically designed for particular applications. Particular embodiments of the invention provide structures for holding such cards.

FIG. 1A depicts an exemplary off-the-shelf card 10 of the type which may be held in a structure according to the invention. The exemplary card 10 of FIG. 1A is a card which complies with the CardBus™ PC Card standard developed by the PCMCIA. A non-limiting example of such a card 10 is the D-Link™ DWL-650 Wireless 2.4 GHz Cardbus™ Adapter sold by D-Link Corporation of Tapei, Taiwan. Card 10 comprises a PCB (not shown) incorporating semiconductor and/or discrete electronic components (not shown) which are covered by a covering shroud 12. The components of card 10 may be fabricated on either or both sides of the PCB. Shroud 12 may provide some protection of the components of card 10 from physical contact, electrostatic discharge (ESD) and/or radiation. Shroud 12 may also help to dissipate heat directly from card 10 and its components. Interior surface(s) of shroud 12 may comprise features, such as slots, grooves or ledges for receiving the PCB or other components of card 10. Shroud 12 comprises a generally flat front surface 11 and a generally flat back surface (not shown in the FIG. 1A view). Front shroud surface 11 and the back shroud surface preferably constitute two large flat surfaces of shroud 12. These surfaces may be the largest flat surfaces of shroud 12.

Card 10 comprises a connector 14 at or near one of its ends 16 for connecting to a backplane (not shown in FIG. 1A). Connector 14 may include a plurality of individual electronic connections 14A. Preferably (but not necessarily), individual electronic connections 14A of connector 14 are "female type" 40 connections. The individual connections 14A of connector 14 may be wire bonded to the components of card 10.

In the illustrated card 10, and other cards which comply with various standards, the individual electronic connections 14A of connector 14 have a standardized pin out. The individual electronic connections of connector 14 may comprise a system ground connection and a digital ground connection, which may or may not be electrically coupled to one another. Standardization of connectors 14 promotes modularity. Structures and/or backplanes according to the invention may be designed to take advantage of such modularity. For example, the standardized pin outs of connectors 14 allow card holding structures to provide standardized slots through which card 10 may extend and/or backplanes to provide standardized connectors for electrically coupling to connectors 14.

Card 10 may also comprise one or more additional connectors 18 at or near its opposing end 20. Connectors 18 may be used for connection and interaction with external components and/or systems (not shown in FIG. 1A). Connectors 18 may comprise, but are not limited to, electrical connections. Connectors 18 may additionally or alternatively comprise optical connections, hydraulic/pneumatic connections, mechanical connections and/or fluid conduits for example. Where present, connectors 18 are preferably capable of being operably connected to mating connectors (not shown) to enable the components of card 10 to interact with external components and/or systems.

Standardized off-the-shelf cards, like card 10 of FIG. 1A, typically come in standardized sizes. For example, Card-Bus™ cards are typically 54 mm wide and 5 mm thick (although there are some thicker Cardbus™ cards). To accommodate such cards, shrouds 12 may be made available which have dimensions (length, width and thickness) in a variety of standard sizes. The standardization of the dimensions of shroud 12 promotes modularity. Card holding structures according to various embodiments of the invention may be designed to take advantage of this modularity. For example, card holding structures which have regularly spaced bays for receiving standard-sized cards in an spatially efficient manner and may have regularly sized slots through which the cards may extend for operable connection to the backplane. Standardized card dimensions also assist with the robotic manufacturing of cards.

Figure 1B:
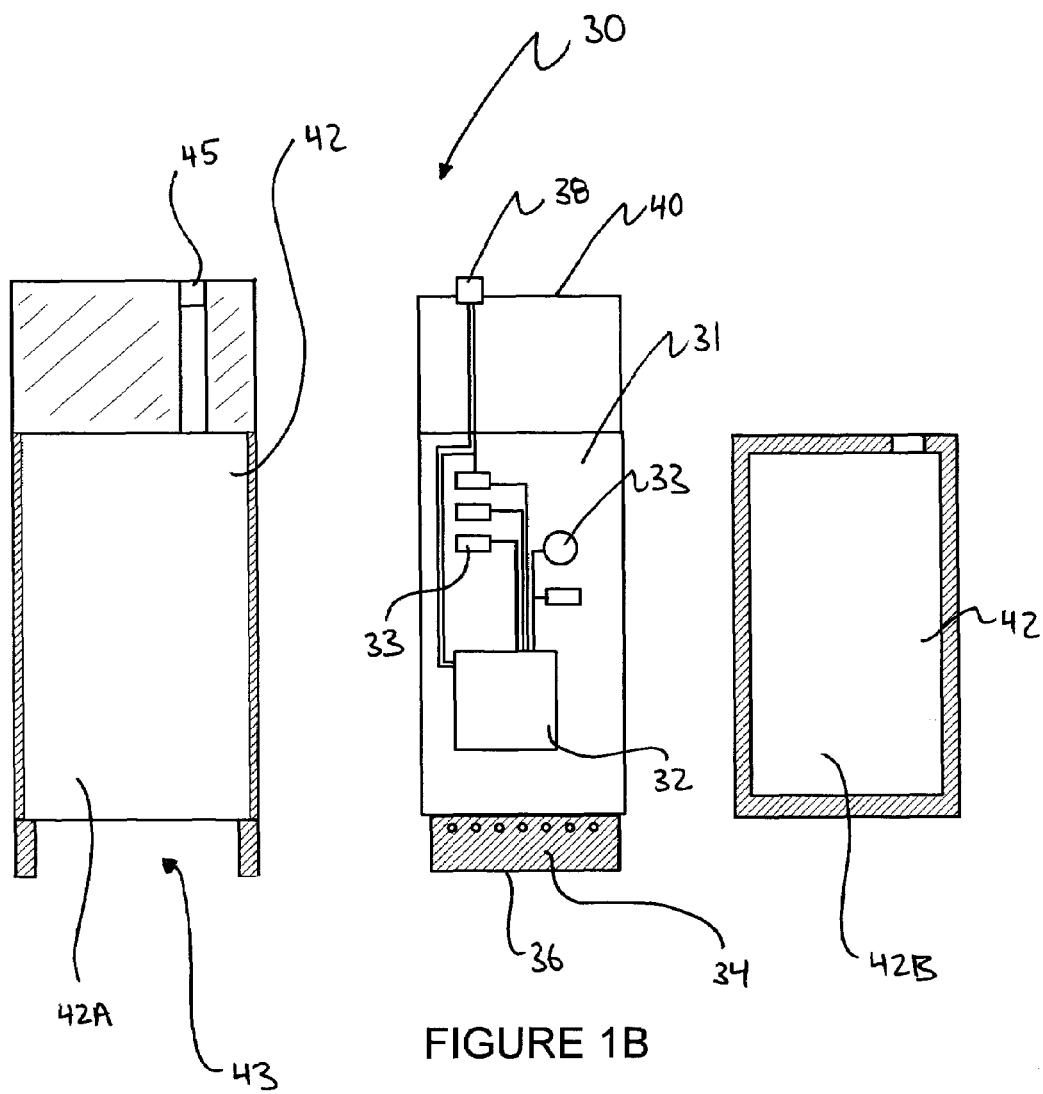
FIG. 1B is an exploded plan view of an application-specific card of the type that may be held in the structures of the present invention.
Figure 2:
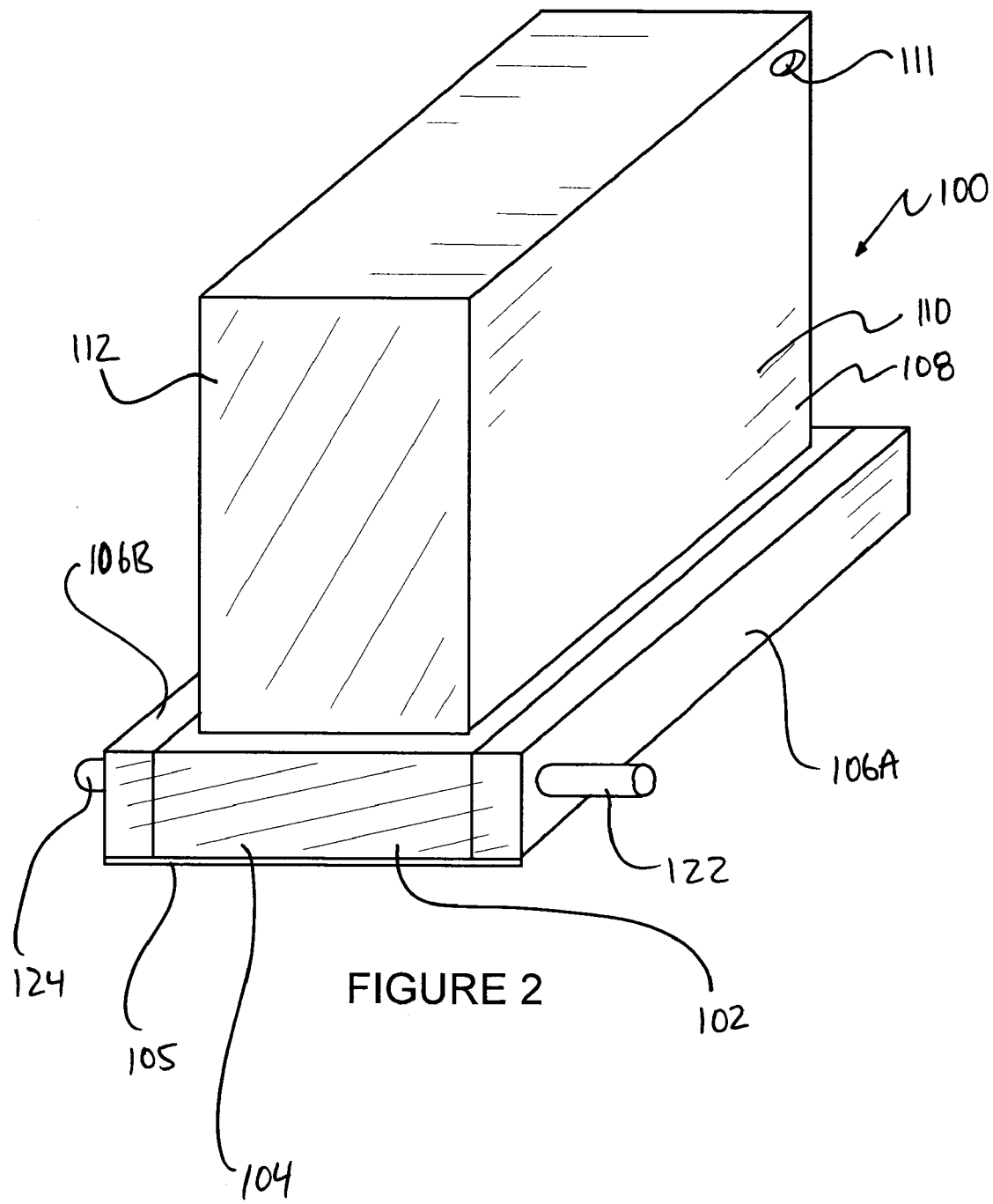
FIG. 2 is an isometric view of a structure for holding cards incorporating electronic and/or micromachined components according to a particular embodiment of the invention.

FIG. 1B is an exploded plan view of an application-specific card 30 of the type which may be held in a structure according to the invention. The illustrated card 30 of FIG. 1B comprises a PCB 31 having a microprocessor chip 32 and other components 33. The components of card 30 (including chip 32 and other components 33) may be fabricated on either or both sides of PCB 31. In the FIG. 1B illustration, chip 32 includes a large number of relatively small microelectronic components (not shown) which run at relatively high frequency and which generate a relatively large amount of heat. When card 30 is assembled, PCB 31 and chip 32 are housed in shroud 42. In the FIG. 1B illustration, shroud 42 comprises a front member 42A and a back member 42B. Interior surfaces of shroud 42 may comprise features, such as ledges, grooves or slots (not shown) for receiving PCB 31 or other components of card 30.

Shroud 42 is preferably fabricated from material(s) which are relatively heat conductive in comparison to the active components of card 30. The material(s) from which shroud 42 is fabricated may include a variety of metals and/or composites, for example. Thermally-conductive material (not shown) may fill gaps between the component(s) of card 30 and shroud 42 to provide a direct, low impedance heat conduction path therebetween. Such thermally-conductive material may comprise thermally-conductive pastes, foams and/or tapes, for example. A particular example of suitable thermally-conductive material is the material sold under the brand name THERM-A-GAP™, by Chomerics of Woburn, Mass. The thermal conductivity of shroud 42 and the low impedance thermal conduction path provided by shroud 42 in combination with the thermally-conductive material may help to dissipate heat away from card 30 and its component(s) and into shroud 42.

Shroud 42 also encases card 30 to provide protection from physical contact for card 30 and its component(s). Shroud 42 may also provide some protection for the components of card 30 from electrostatic discharge (ESD). Where shroud 42 is fabricated from metal, it may act to shield card 30 and its component(s) from electromagnetic interference (EMI). Where shroud 42 is fabricated from other materials, such as thermally-conductive composite(s), card 30 and its component(s) may be coated with an electrically-conductive spray which provides shielding from EMI. Such sprays are well known in the art. In circumstances where card 30 is to be deployed in an environment having high levels of radiation, shroud 42 may be fabricated with one or more layer(s) of material which absorbs or blocks such radiation.

The components of card 30 may include a plurality of electrical contacts (not shown) which may be electrically connected directly and/or through peripheral components to connector 34 at or near one end 36 of card 30. Connector 34 may be used to couple the pins of chip 32 and the other components 33 of card 30 to a backplane (not shown in FIG. 1B). Shroud 42 may be provided with a cutout region 43 to permit access to connector 34. Connector 34 preferably comprises a plurality of individual connections (not shown) which may be similar to connections 14A of connector 14 of card 10 (FIG. 1A). Electrical connections between the components 32, 33 of card 30 and the individual electronic connections of connector 34 may be implemented by wire bonding, surface mount wiring or any other suitable technique.

The components of card 30 may also be electrically connected directly and/or through peripheral components to individual connections (not shown) in connector 38 at or near the opposing end 40 of card 30. Shroud 42 may be provided with a cutout region 45 to permit access to connector 38. Connectors 34, 38 are not generally limited to electrical connectors. Connectors 34, 38 may additionally or alternatively comprise optical connections, hydraulic/pneumatic connections, mechanical connections and/or fluid conduits for example.

FIGS. 2 to 8 depict various aspects of a structure 100 for holding cards according to a particular embodiment of the invention. Structure 100 is suitable for deployment in mobile robotic systems, but is not limited to such applications. As shown best in FIG. 2, structure 100 of the illustrated embodiment comprises a chassis 102 and a cover 108 which define an enclosure (not visible in FIG. 2) therebetween. Chassis 102 comprises a base 104 and may also comprise side members 106A, 106B (collectively 106) and bottom plate 105. In alternative embodiments, base 104 and side members 106 of chassis 102 may comprise a single integral component.

In the illustrated embodiment, cover 108 comprises central cover member 110 and side cover members 112. In alternative embodiments, cover 108 comprises a single integral cover member. Cover 108 preferably comprises at least one port 111 for routing electrical connections, optical connections, hydraulic/pneumatic connections, fluid conduits, mechanical connections or the like to an external environment.

Figure 6:
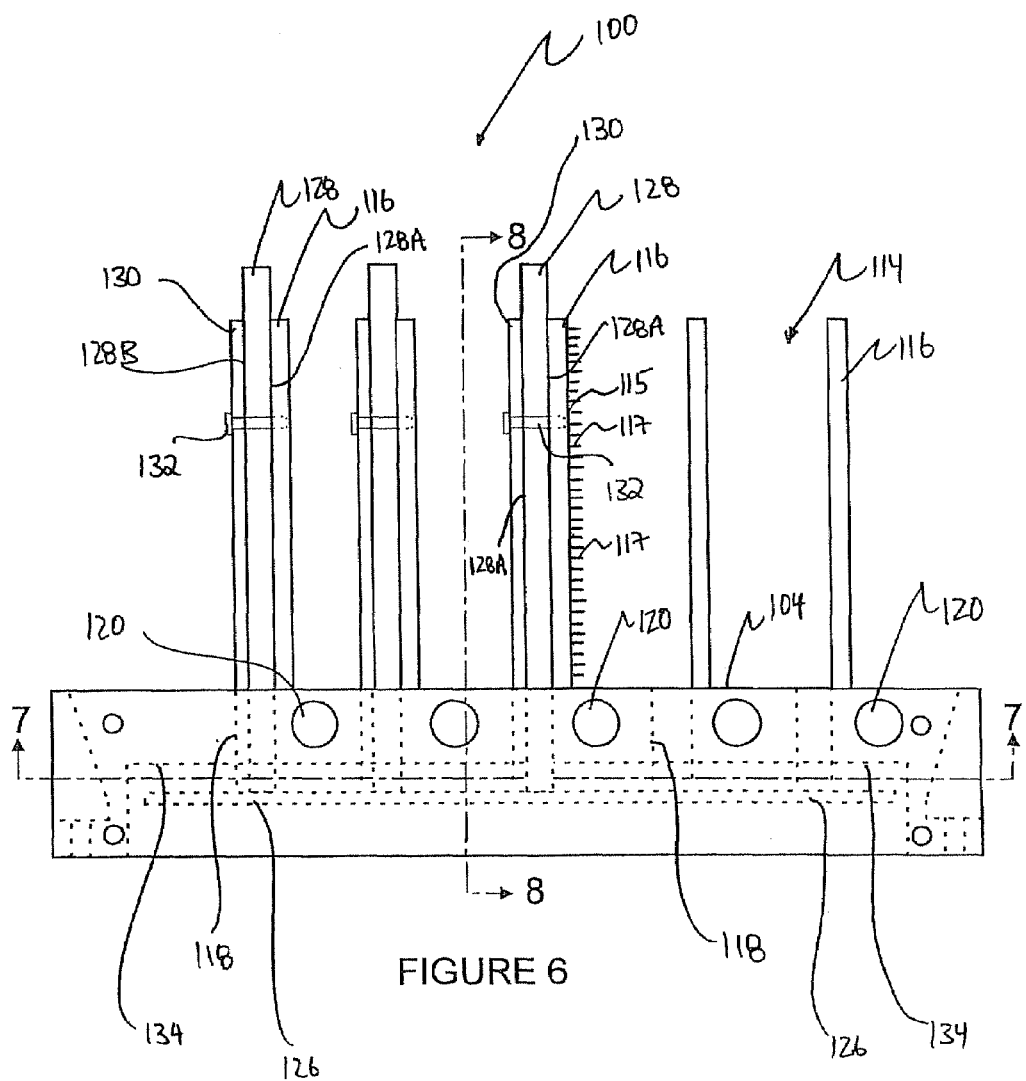
FIG. 6 is a schematic side view of the chassis of the FIG. 2 structure showing a plurality cards held in the structure in accordance with a particular embodiment of the invention.

Structure 100 holds cards 128 in the enclosure formed between cover 108 and chassis 102 (see FIG. 6). Structure 100 protects cards from various aspects of the external environment. Cover 108 and chassis 102 help to prevent physical contact with cards 128. Cover 108 and chassis 102 may be fabricated from metallic material(s) to shield cards 128 held in structure 100 from external electromagnetic interference. In some embodiments, parts of cover 108 may be fabricated from non-metallic materials, such as thermoplastic (e.g. plexiglass™), which permit wireless communication between components in the enclosure and the external environment.

Cover 108 and bottom plate 105 may be sealed to chassis 102 by gasket material (not shown) or otherwise and port 111 may be similarly sealed with a sealing grommet or the like, such that the environment in the enclosure of structure 100 is not in fluid communication with the external environment. Such isolation may prevent the intrusion of moisture or humid air into the enclosure of structure 100 and may thereby reduce corrosion and other harmful effects associated with moisture.

The enclosure of structure 100 may be pressurized, evacuated or filled with fluid. For example, if structure 100 is deployed in outer space, it may be desirable for cards held in structure 100 to operate at a desired pressure, notwithstanding a lack of pressure in the external environment. As another example, it may be advantageous to fill the structure 100 enclosure with dry air, nitrogen or another gas to permit operation in cold temperature environments, where there is a risk of moisture (i.e. water) being suspended in the air and such moisture penetrating the enclosure to damage or otherwise effect the operation of the cards held therein.

Figure 3:
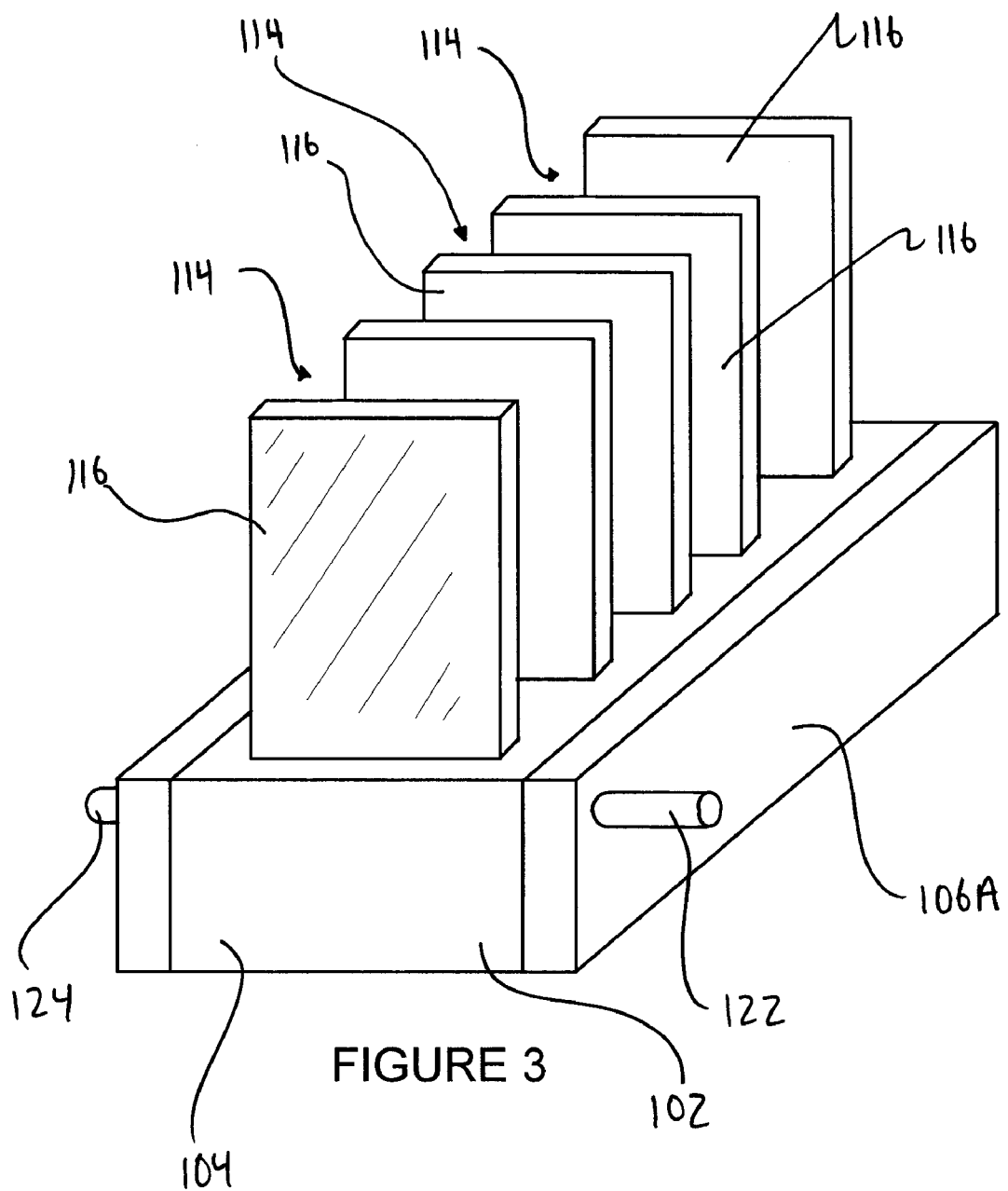
FIG. 3 is an isometric view of the FIG. 2 structure with its cover removed to show internal detail of its chassis.
Figure 4A:
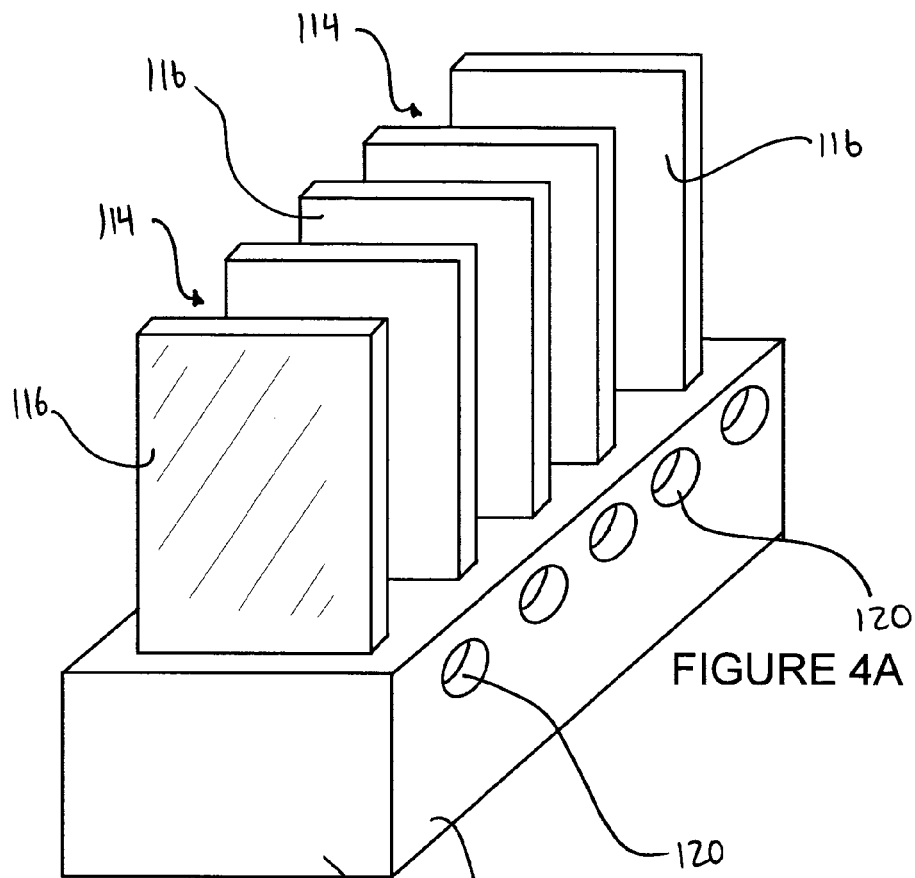
FIG. 4A is an isometric view of the FIG. 2 structure with its cover and side members removed to show more internal detail of its chassis.
Figure 4B:
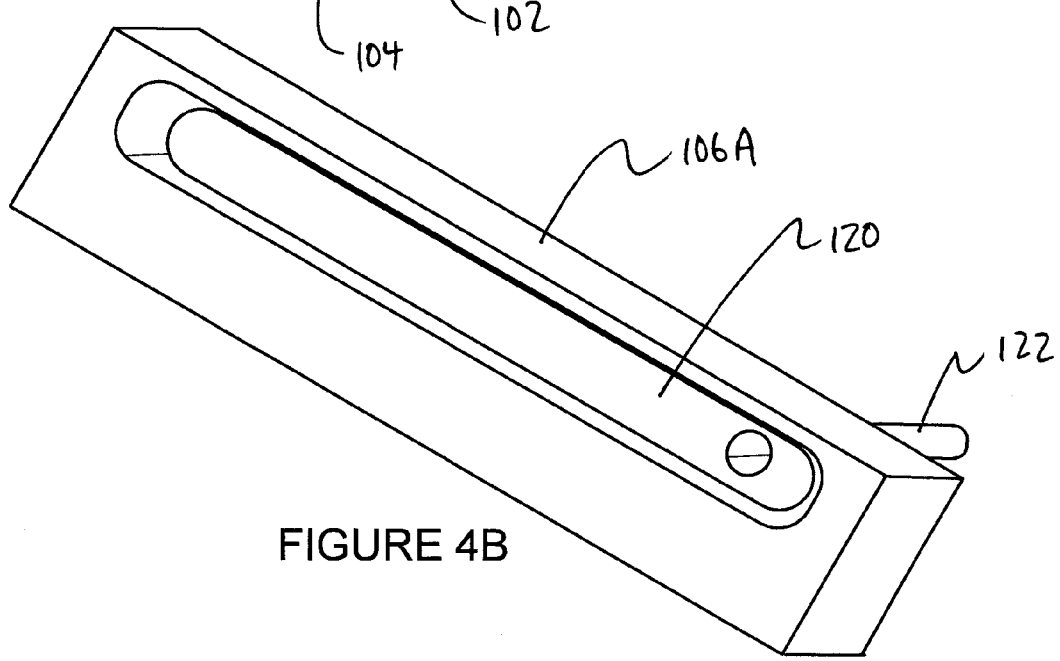
FIG. 4B is an isometric view of one of the side members of the FIG. 2 structure.
Figure 5:
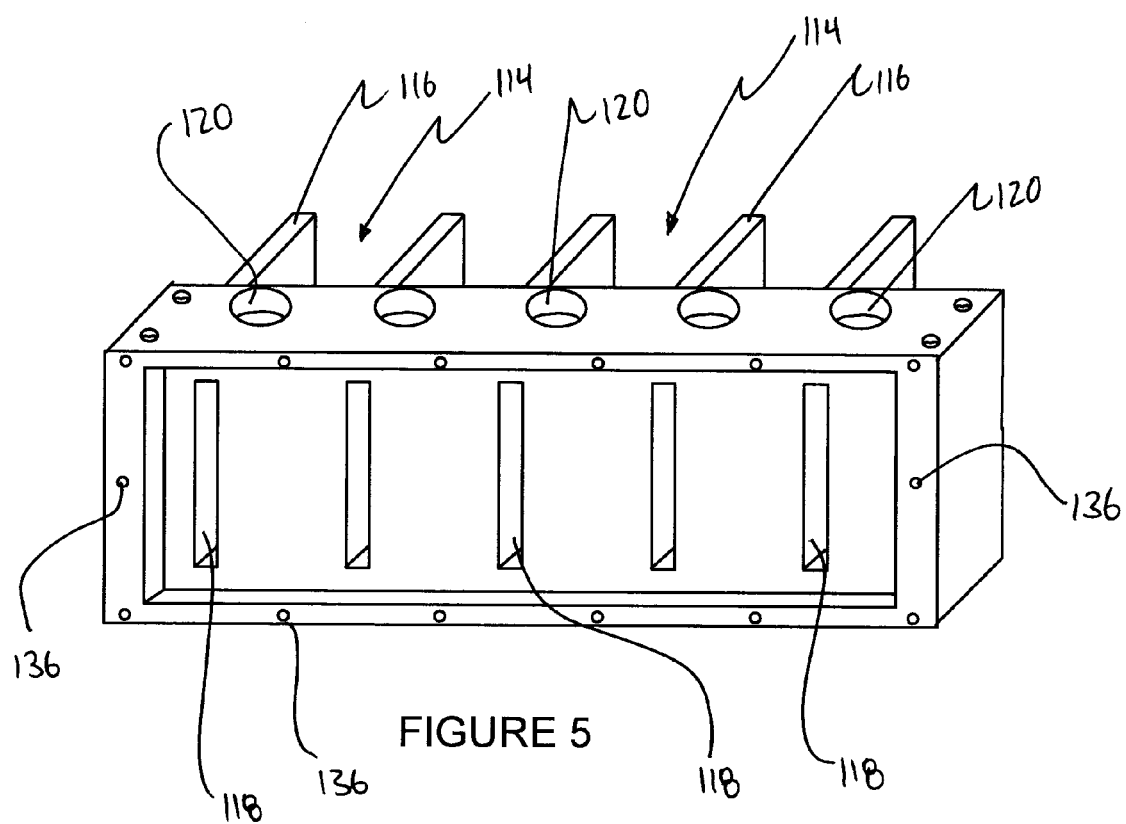
FIG. 5 is a different isometric view of the FIG. 2 structure with its cover and side members removed to show more internal detail of its chassis.

FIGS. 3 to 5 depict chassis 102 with cover 108 and bottom plate 105 removed to show more internal detail of chassis 102, including base 104 and side members 106. In the embodiment illustrated in FIGS. 3 to 5, chassis 102 comprises a plurality of fin front-plates 116 which extend away from base 104 on one side thereof. Fin front-plates 116 are preferably made from metal or some other thermally-conductive material. In preferred embodiments, base 104 and fin front-plates 116 are integrally formed. Integral formation of fin front-plates 116 and base 104 can provide a combination of high strength for chassis 102 (and corresponding protection for cards 128 held in structure 100) together with high heat conduction characteristics in a monolithic unit. In alternative embodiments, fin front-plates 116 may be formed separately from base 104 and may be mounted to base 104 by welding, press fitting, mechanical fastening or any other suitable technique. Preferably, the techniques used to mount fin front-plates 116 to base 104 permit low impedance thermal conductivity therebetween.

Each fin front-plate 116 forms a part of a corresponding bay 114 for receiving a corresponding card 128. Each bay 114 comprises at least one fin front-plate 116 and a slot 118 that extends through base 104 (see FIG. 5) from one side 104A of base 104 to the other 104B.

Figure 7:
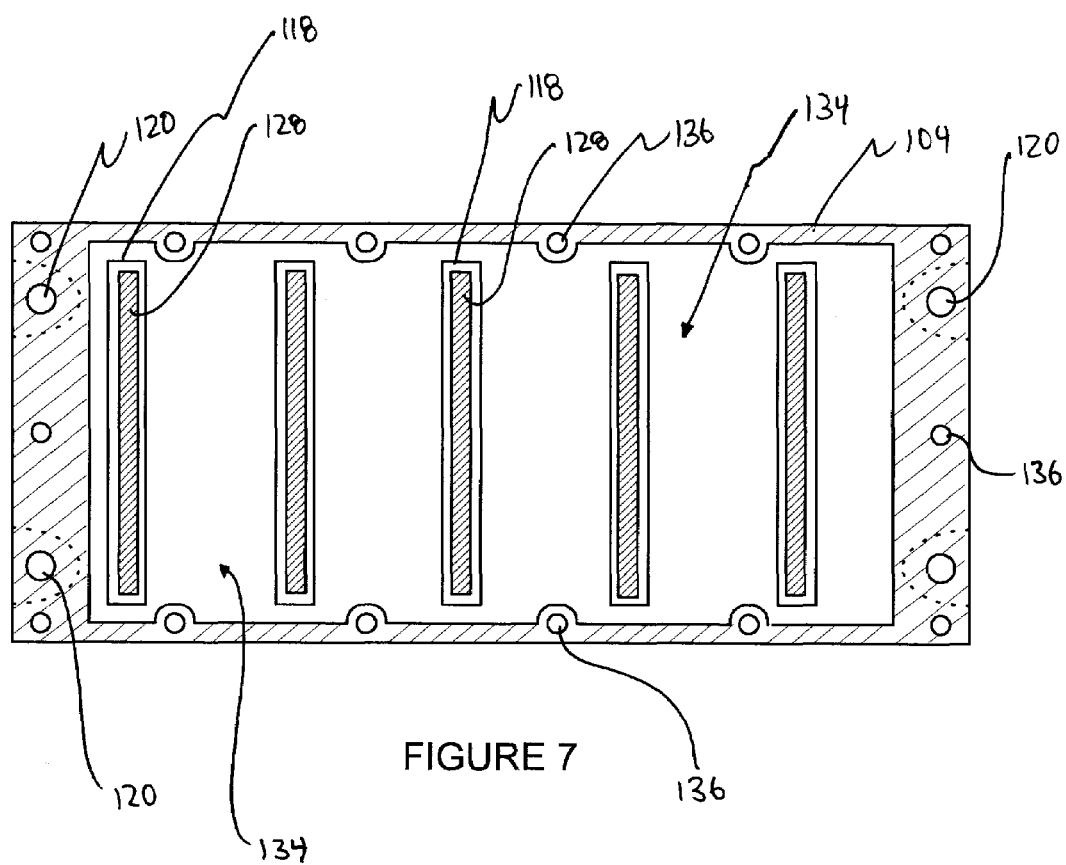
FIG. 7 is a schematic cross-sectional view of the FIG. 6 chassis taken along the line 7-7.
Figure 8:
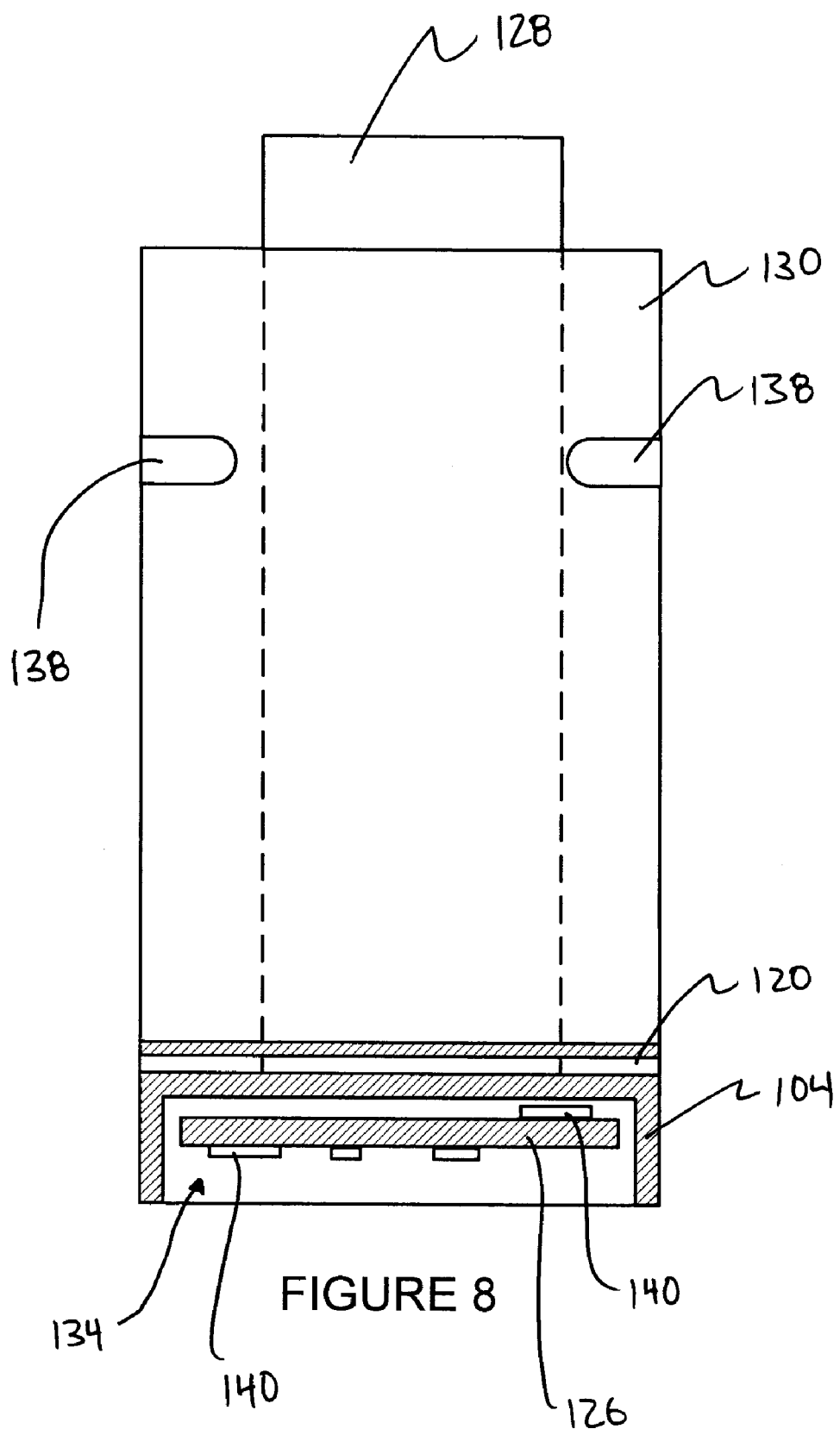
FIG. 8 is a schematic cross-sectional view of the FIG. 6 chassis taken along the line 8-8.

FIGS. 6 to 8 show various schematic views of structure 100 which depict how cards 128 are received in bays 114. As discussed above, cards 128 are preferably encased in heat conducting shrouds (not enumerated in FIGS. 6 to 8). Cards 128 are received in bays 114 such that they extend through slots 118 in base 104 to allow their connectors (not shown in FIGS. 6 to 8) to connect to a backplane 126 located in a concave region 134 on the bottom side 104B of base 104. Bays 114, slots 118, fin front-plates 116 and other components of structure 100 may be dimensioned to accommodate cards 128 having shrouds with standardized sizes. For example, slots 118 may be just larger than the 54 mm by 5 mm or 55 mm by 10 mm dimensions of standard Cardbus™ sized cards to permit such cards to extend therethrough or slots 118 may be just larger than the 34 mm by 5 mm dimensions of standard ExpressCard™ sized cards to permit such cards to extend therethrough.

Backplane 126 may comprise connectors (not shown in FIGS. 6-8) which correspond to those of cards 128. Connectors on cards 128 and backplane 126 are preferably electrical connectors, but may additionally or alternatively comprise optical connections, hydraulic/pneumatic connections, fluid conduits, mechanical connections or the like. These connectors may be similar to the connectors 14, 34 discussed above for cards 10, 30.

Backplane 126, cards 128 and their connectors may comprise components which interact with one another according to various standards. For example, backplane 126 and cards 128 may interact in accordance with a bussed communication standard, such as the bussed communication standards described in U.S. patent application Ser. No. 10/849,869, which is hereby incorporated by reference herein. Backplane 126 may comprise electronic, optical, hydraulic/pneumatic, fluid control and/or mechanical component(s) 140 (see FIG. 8) which permit interaction between cards 128 and their components.

Chassis 102 comprises a bottom plate 105 (FIG. 2), which is coupled to an undersurface of base 104 to encase backplane 126 in concavity 134. Bottom plate 105 may be coupled to base 104 via fasteners which project into threaded holes 136 formed in base 104 or by any other suitable construction. Bottom plate 105 may be sealed to base 104 using gasket material or otherwise. Such sealing may provide similar advantages to those discussed above in relation to the seal between chassis 102 and cover 108. In other embodiments, concavity 134 is not required and bottom plate 105 may be fashioned with a depressed region that will accommodate and hold backplane 126.

In the illustrated embodiment of FIGS. 6 to 8, structure 100 holds three cards 128. Each card 128 is located in a corresponding bay 114 such that its front shroud surface 128A abuts against a surface of its corresponding fin front-plate 116. This abutting relationship provides a low impedance thermal conduction path from card 128 (and its components), to its shroud, to its corresponding fin front-plate 116 and from its corresponding fin front-plate 116 to base 104.

As discussed above, it is preferable to provide a relatively large surface area contact between front shroud surface 128A and fin front-plates 116 to maximize the heat transfer therebetween. Preferably, front shroud surface 128A is generally flat and is one of the two largest flat surfaces of the shroud of card 128. Thermally-conductive material may be provided between front shroud surface 128A and fin front-plate 116 to enhance the heat transfer characteristics. Fin front-plates 116 and base 102 are preferably fabricated from relatively highly thermally-conductive material, such that heat from the components of cards 128 may be quickly conducted away from cards 128.

Fin front-plates 116 in combination with base 104 form a low impedance heat sink throughout which heat is easily conducted. Where the various components of chassis 102 are fabricated from the same material, base 104 and side members 106 (together) are preferably significantly more massive than the individual fin front-plates 116. In some embodiments, the ratio of the mass of base 104 and side members 106 to a single fin front-plate is greater than 5:1.

Regardless of mass, base 104 preferably comprises more material (volume) than fin front-plates 116. The relatively large amount of mass and/or material in base 104 (relative to fin-front plates 116) moderates temperature differences between various parts of structure 100 and its cards 128. This moderation of temperature differences results in higher reliability of the components of cards 128 by reducing the occurrence of stress fractures caused by materials having different thermal expansion coefficients and/or by materials having similar expansion coefficients, but which experience different temperatures.

Heat may be conducted from a card 128 which generates a relatively large amount of heat and dissipated through other fin front-plates 116 (i.e. fin front-plates 116 corresponding to empty bays 114 or to bays 114 holding relatively low power cards 128) and/or through base 104. In this manner, the heat sink provided by base 104 and fin front-plates 116 may also move heat from warmer cards 128 to cooler cards 128. Some heat may be dissipated directly away from fin front-plates 116 and/or base 104 by radiation, conduction or convection. Other heat may be dissipated by conduction and/or convection via a network of fluid conduits 120 discussed in more detail below. Fin front-plates 116 and base 104 may dissipate heat from the components on backplane 126 in a similar manner.

In the illustrated embodiments, the surfaces of fin front-plates 116 which abut against the front shroud surfaces 128A of cards 128 are flat. The opposing surfaces of fin front-plates 116 (i.e. the surfaces of fin front-plates 116 to which cards 128 do not abut) may also be flat or may alternatively have a non-flat profile for maximizing the surface area of fin front-plates 116 and their ability to dissipate heat directly to the environment.

In the illustrated embodiment of FIGS. 6-8, cards 128 are releasably held against their corresponding fin front-plates 116 by fin back-plates 130. Each fin back-plate 130 abuts against a back shroud surface 128B of its corresponding card 128. In the illustrated embodiment, fasteners 132 extend through cutouts 138 in fin back-plates 130 to releasably couple each fin back-plate 130 to a corresponding fin front-plate 116. Fasteners 132 may be tightened to clamp a card 128 between a fin back-plate 130 and its corresponding fin front-plate 116. Cutout 138 may be replaced by other suitable apertures. Other mechanisms for coupling fin back-plates 130 to fin front-plates 116 may also be employed to clamp cards 128 therebetween.

Fin back-plates 130 are preferably fabricated from material having a relatively high thermal conductivity, such that they may conduct heat away from cards 128. As discussed above, it is preferable to provide a large surface area contact between back shroud surface 128B and fin back-plates 130 to maximize the heat transfer therebetween. Preferably, back shroud surface 128B is generally flat and is one of the two largest flat surfaces of the shroud of card 128. Thermally-conductive material may be provided between fin front-plates 116 and fin back-plates 130 and between fin back-plates 130 and the back shroud surfaces of their corresponding cards to enhance heat transfer characteristics.

Heat may be conducted from cards 128 and their components, to their shrouds and to fin back-plates 130, where it may radiate. In the illustrated embodiment, fin back-plates 130 have at least one flat surface for abutting against corresponding flat surfaces of the shrouds of cards 128. The opposing surfaces of fin back-plates 130 (i.e. the surfaces of fin back-plates 130 to which cards 128 do not abut) may also be flat or may alternatively have a non-flat profile for maximizing the surface area of fin back-plates 130 and their ability to dissipate heat. In the illustrated embodiment, fin back-plates also extend downwardly to contact, and provide a thermal conduction path to, base 104. Accordingly, heat may be conducted from cards 128 and their components, to their shrouds, to fin back-plates 130 and then into base 104.

As shown in FIGS. 3 to 8, chassis 102 comprises an ingress port 122, an egress port 124 and a network of conduits 120 for conducting fluid. The conduction of fluid through chassis 102 helps to redistribute the heat created by cards 128 and their components and may be used to dissipate heat from cards 128 and their components and/or to regulate the temperature of cards 128 and their components. In the illustrated embodiment, the network of conduits 120 is located in base 104 and side members 106. In other embodiments (discussed in more detail below), the network of conduits 120 may extend from base 104 into fin front-plates 116.

In some embodiments, fluid is cooled by an external cooling system (not shown) prior to entering ingress port 122, is warmed as it travels through the network of conduits 120 and helps to dissipate heat from cards 128 (which has been conducted to base 104 through fin plates 116, 130), and then exits egress port 124, where it flows to the external cooling system to be cooled again. The heat dissipated in such external cooling systems may be used by other external systems for other applications requiring energy, such as heating an external environment for example. In the illustrated embodiment, conduits 120 are circular in cross-section. In alternative embodiments, conduits 120 may have some other cross-sectional profile which provides increased surface area to volume ratio to increase the heat dissipation characteristics of conduits 120.

Preferably, cards 128 which consume the most power and/or generate the most heat are located in bays 114 which are as close as possible to ingress port 122, while lower power or lower heat generating cards 128 are located in bays 114 which are closer to egress port 124. In some applications, the operational characteristics of particular cards 128 (and/or their components) may be more sensitive to heat than others. In such applications, the most heat sensitive cards may be located in bays 114 which are as close as possible to ingress port 122, while less sensitive cards 128 may be located in bays 114 which are closer to egress port 124.

Figure 13:
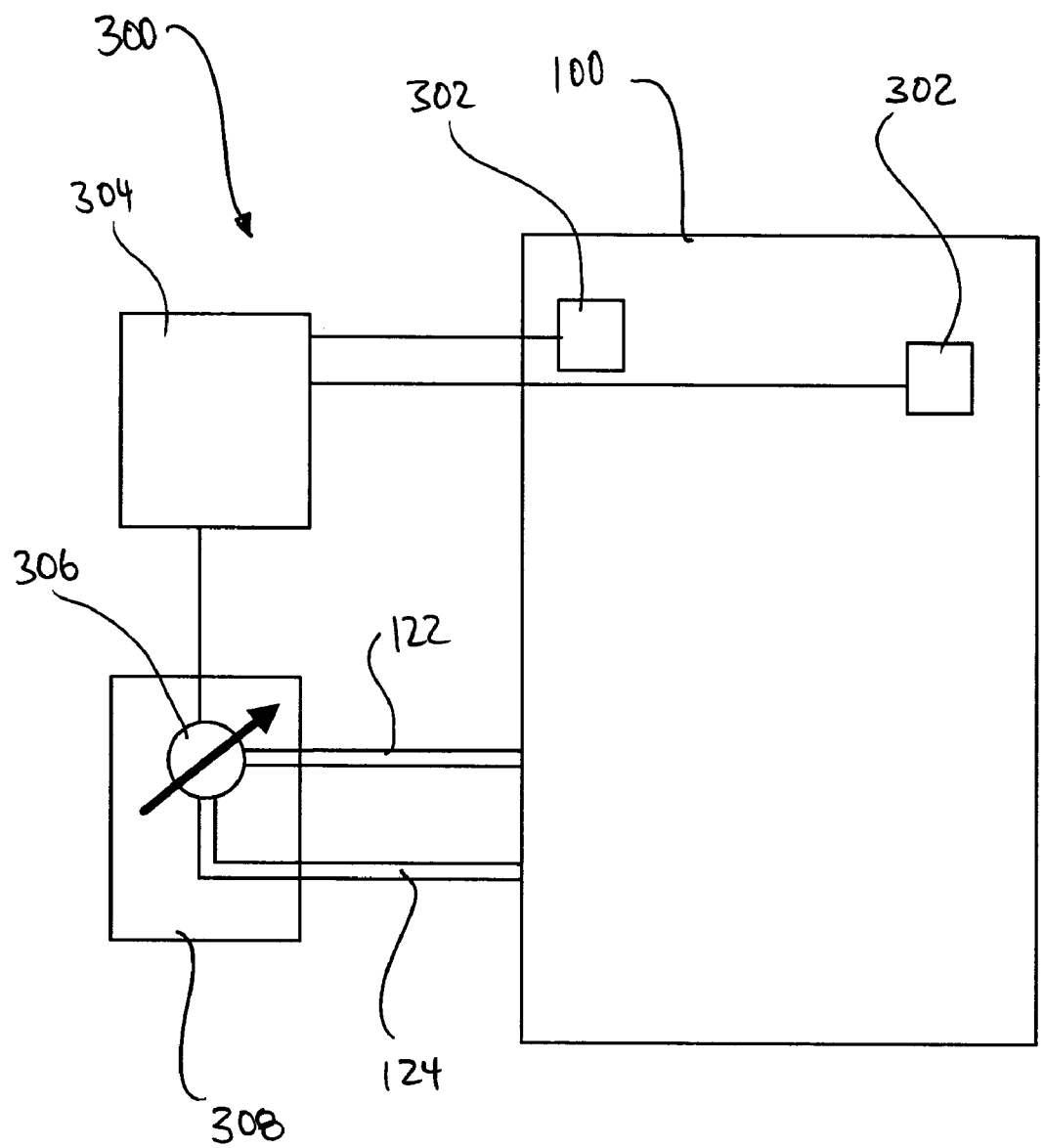
FIG. 13 is a schematic diagram showing an active temperature control system according to a particular embodiment Of the invention.

In some embodiments, the network of conduits 120 form part of an active temperature control system. Such a temperature control system 300 is shown schematically in FIG. 13. System 300 comprises one or more temperature feedback sensors 302 which are provided on base 104, side member(s) 106, one or more of fin front-plates 116, one or more of cards 128 and/or backplane 126. The signals from temperature sensors 302 may be digitized and/or conditioned by signal conditioning circuitry (not shown) before being fed back to controller 304. Controller 304 uses information from temperature feedback sensor(s) 302 to control one or more actuators 306. Actuators 306 may control various characteristics of the cooling fluid that flows into ingress port 122, through conduit network 120 and out of egress port 124. In the illustrated embodiment, actuator 306 controls the amount of cooling applied by external cooling system 308 and/or the amount of cooling fluid that comes from external cooling system 308, which in turn controls the temperature and/or amount of the cooling fluid supplied to ingress port 122 and the temperature of the cards (not shown) in structure 100. Other types of actuators 306 may be employed. Non-limiting examples of actuators 306 suitable for implementing temperature control systems include controllable pneumatic/hydraulic elements, such as valves, pumps, pistons and cylinders, for example.

Figure 9:
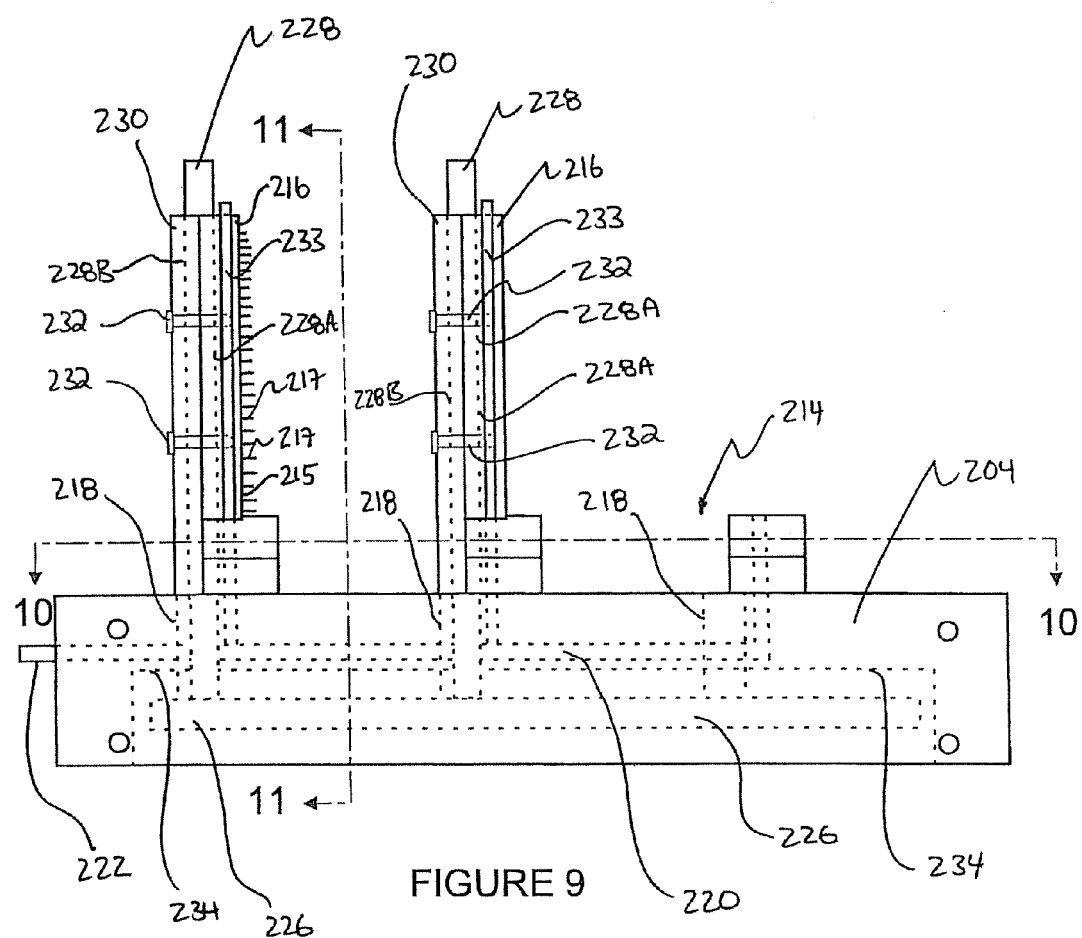
FIG. 9 is a schematic side view of the chassis of a structure according to another embodiment of the invention showing a plurality cards held in the structure.
Figure 10:
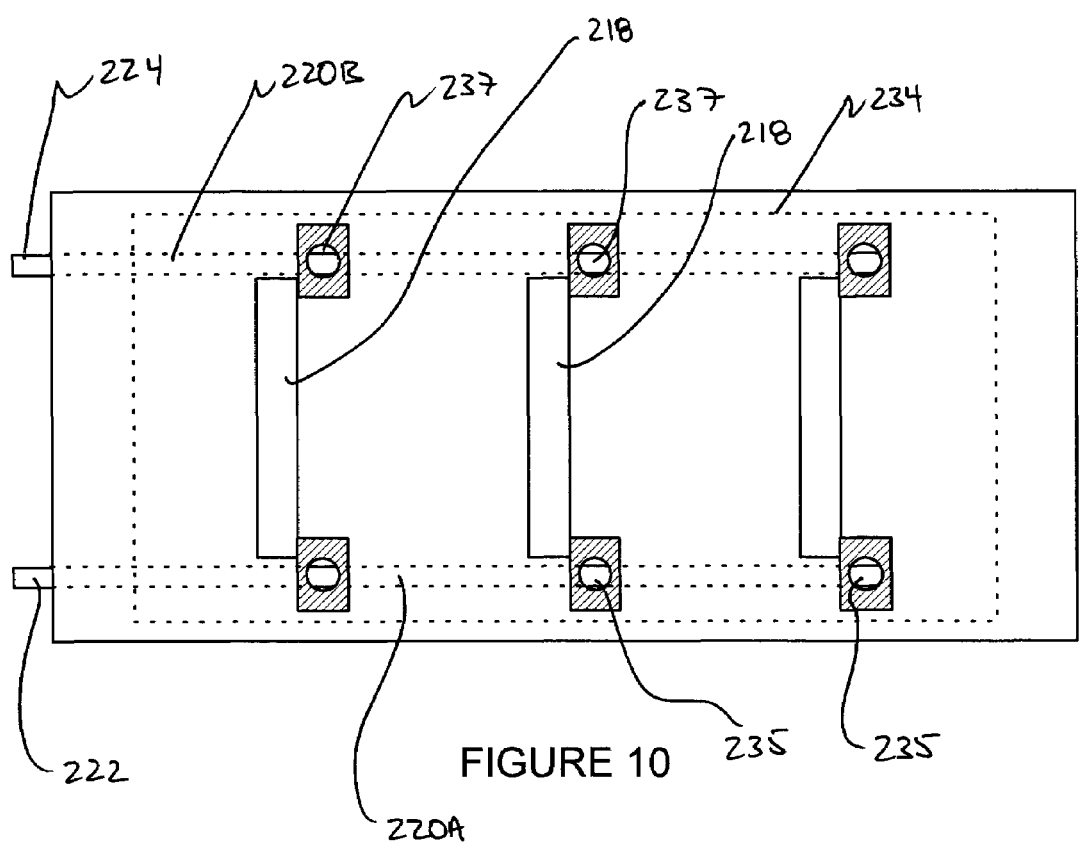
FIG. 10 is a cross-sectional view of the FIG. 9 structure (with its cards removed) taken along the line 10-10.
Figure 11:
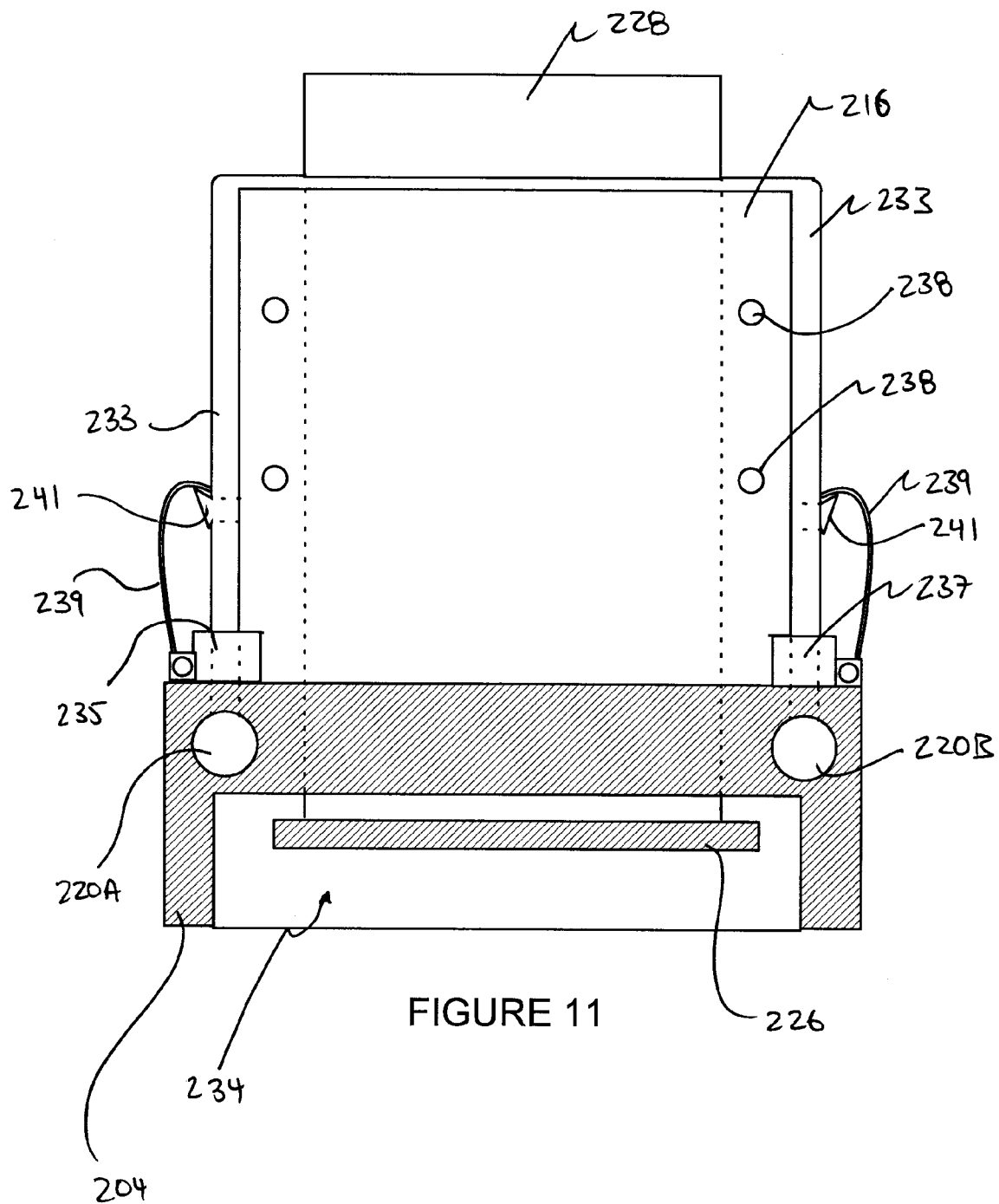
FIG. 11 is a cross-sectional view of the FIG. 9 structure taken along the line 11-11.

FIGS. 9 to 11 depict various views of a structure 200 for holding cards according to another embodiment of the invention. In many respects, structure 200 is similar to structure 100 described above. Components of structure 200 that are similar to components of structure 100 are referred to using reference numerals where the initial digit "1" is replaced by "2". The principal difference between structure 200 and structure 100 is that structure 200 facilitates the flow of cooling fluid from conduit network 220 in base 204 into fin front-plates 216 and then back into conduit network 220 again. In this manner, cooling fluid can also be used to conduct heat away from fin front-plates 216.

As with the previously described embodiment, cards 228 abut against fin front-plates 216. As shown in FIG. 9, cards 228 are releasably clamped between fin front-plates 216 and fin back-plates 230 and are received in bays 214 where they project through slots 218 of base 204 and into back plane 226 which is located in concave region 234. Fin front-plates 216 and fin back-plates 230 differ slightly from fin front-plates 116 and fin back-plates 130 in that fin front-plates 216 and fin back-plates 230 wrap around the edges of cards 228 as shown most clearly in FIG. 9. This feature of fin front-plates 216 and fin back-plates 230 is not necessary. In the embodiment of FIGS. 9 to 11, fin front-plates 216 and fin back-plates 230 are releasably fastened to one another by a pair of fasteners 232 (rather than a single fastener 132) on each side of card 228.

As shown best in FIG. 11, fin front-plates 216 also comprise a front fin fluid conduit 233 that extends around their side and top edges. Front fin fluid conduit 233 is connected to an inlet coupler 235 on a first side of fin front-plate 216 and to an outlet coupler 237 on the opposing side of fin front-plate 216. As shown best in FIG. 10, inlet couplers 235 provide for fluid communication between front fin fluid conduits 233 and ingress port 222 and inlet conduit 220A of base 204. Similarly, outlet couplers 237 provide for fluid communication between front fin fluid conduits 233 and egress port 224 and outlet conduit 220B of base 204.

In operation, cooling fluid enters base 204 through ingress port 222 and flows into inlet conduit 220A. From inlet conduit 220A, cooling fluid flows through inlet coupler 235 and into the front fin fluid conduit 233 of each fin front-plate 216. The cooling fluid then travels through front fin conduits 233 (where it absorbs heat energy from fin front-plates 216) before exiting through outlet coupler 237 and into outlet conduit 220B of base 204. From outlet conduit 220B, the cooling fluid exits base 204 through egress port 224. Once outside of base 204, the cooling fluid can be cooled by an external heating system as described above.

By traveling through front fin fluid conduits 233, the cooling fluid helps to conduct heat away from front fin plates 216 and thereby to conduct heat away from cards 228 and their components. The use of cooling fluid in this manner decreases the need for thermal conductivity between fin front-plates 216 and base 204. In some embodiments, a majority of the heat can be dissipated from fin front-plates 216 to base 204 by the movement of cooling fluid that travels around fin front-plates 216 through front fin fluid conduits 233, rather than by direct conduction from fin front-plates 216 into base 204. In some embodiments, the ratio of the amount of heat dissipated from fin front-plates 216 to base 204 by the movement of cooling fluid to the amount of heat dissipated by direct conduction is more than 2:1.

In the embodiment of FIGS. 9 to 11, the contact between fin front-plates 216 and base 204 is not as important, because there is a decreased reliance on thermal conduction between fin front-plates 216 and base 204. In the illustrated embodiment of FIGS. 9 to 11, each bay 214 of base 204 comprises a pair of clips 239 which clip onto projections 241 on fin front-plates 216 to couple fin front plates 216 to base 204. Those skilled in the art will appreciate that clips 239 are merely one technique for fastening fin front-plates 216 to base 204. Many additional or alternative fastening mechanisms may be employed for this purpose. In addition, the assembly of fin front-plate 216, card 228 and fin back-plate 230 may be coupled to base 204 by coupling directly to fin back-plate 230.

Figure 12:
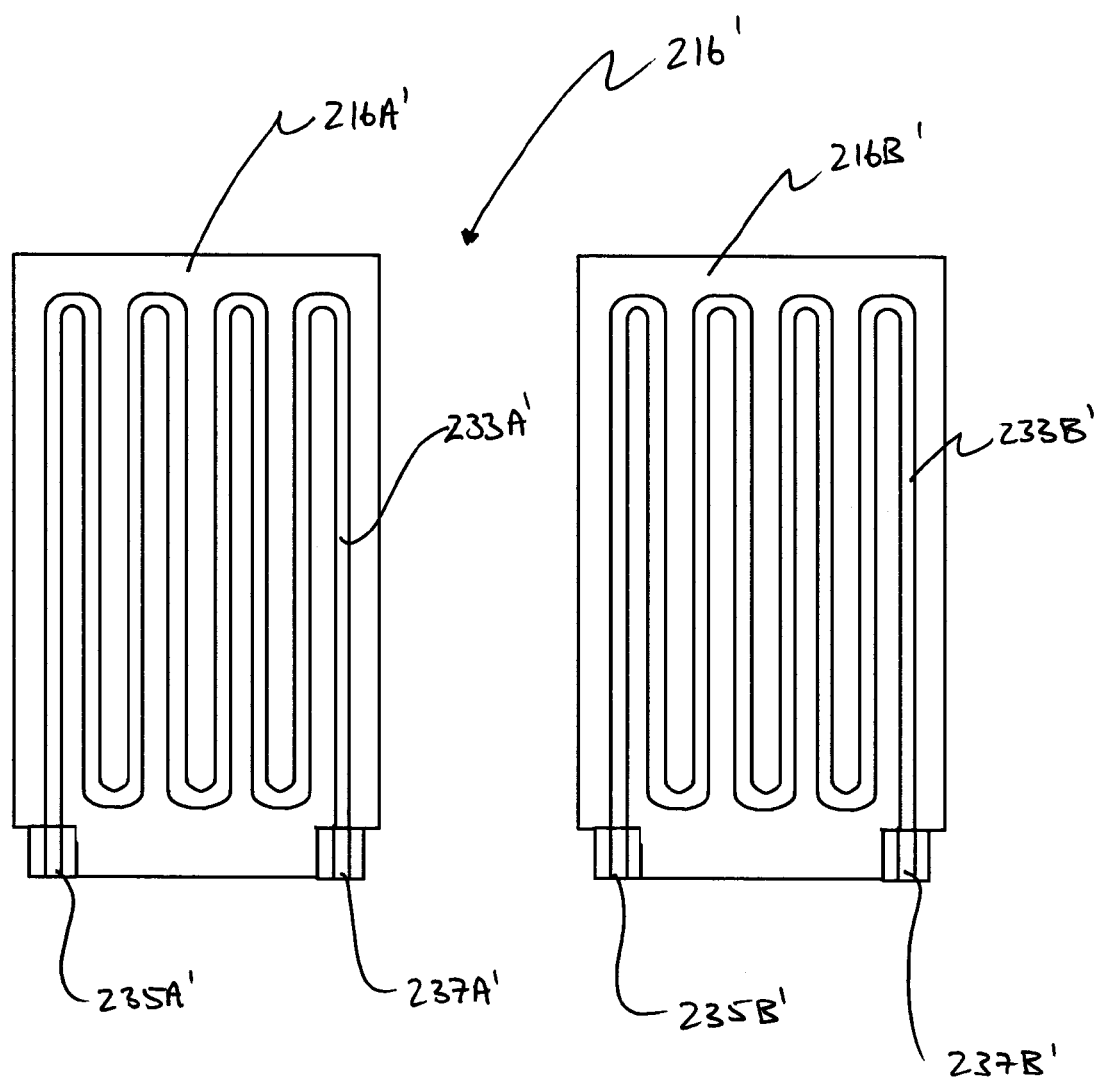
FIG. 12 is an exploded view of a front plate of a fin according to another embodiment of the invention.

In the illustrated embodiment of FIG. 9 to 11, front fin fluid conduits 233 extend around the exterior of fin front-plates 216. In some embodiments, the shape of front fin fluid conduits 233 may be more complex to provide conduits 233 with more surface area contact to the shroud of cards 228 and to thereby improve the ability of the cooling fluid in conduits 233 to dissipate heat. In other embodiments, front fin fluid conduits 233 may extend into an interior of fin front-plates 216. FIG. 12 depicts a fin front-plate 216' according to another embodiment of the invention, wherein fin front-plate 216' is made up of two halves 216A' and 216B', such that a front fin fluid conduit 233' can be formed in two halves 233A', 233B' to run through the body of fin front-plate 216'. Inlet and outlet couplers 235', 237' may similarly be fabricated from two halves 235A', 235B' and 237A', 237B'. It can be seen from FIG. 12 that front fin fluid conduit 233' has a number of folds to increase the amount of surface area exposed to fin front-plate 216.

To facilitate explanation, base 204 illustrated in FIGS. 9 to 11 includes a network of cooling fluid conduits 220 which comprises only input conduit 220A and output conduit 220B. Those skilled in the art will appreciate that there may be more complex networks of conduits in base 204 which will dissipate heat more quickly and/or effectively. In addition, those skilled in the art will also appreciate that as an alternative to (or in addition to) providing front fin fluid conduits 233 for fin front-plates 216, similar cooling fluid conduits may be provided for fin back-planes 230.

In other respects, structure 200 of FIGS. 9 to 11 may be substantially similar to structure 100 of FIGS. 3 to 8.

Fin front plate 216 may optionally include a plurality of heat sink fins 217 (as shown in FIG. 9) on a side 215 of fin front plate 216 opposite its contact surface for dissipating heat from fin front plate 216 into the surrounding environment. Similar heat sink fins 117 may be optionally provided on a side 115 opposite the contact surface of fin front plate 116 in structure 100 (as shown in FIG. 6)

As will be apparent to those skilled in the art in the light of the foregoing disclosure, many alterations and modifications are possible in the practice of this invention without departing from the spirit or scope thereof. For example:

- The card holding structures of the present invention may be mounted on a surface made of elastomeric material for reducing vibration experienced by the cards held therein. Alternatively, vibration may be reduced by mounting the card holding structure on a "floating table" or mounting the card holding structure by way of vibration isolating mounts. Other well known vibration reducing techniques may be employed.
- In the embodiments described above, the shrouds of cards 128 are flat, so as to abut against corresponding flat surfaces of fin front-plates 116 and fin back-plates 130. In alternative embodiments, the surfaces of the shrouds of cards 128 may have some non-flat profile and the corresponding surfaces of fin front-plates 116 and fin back-plates 130 may have complementary non-flat profiles for abutting against the corresponding non-flat surfaces of the shrouds of cards 128. Non-flat profiles may provide additional surface area and improve the thermal conductivity between the shrouds of cards 128 and fin front-plates 128 or fin back-plates 130.

A plurality of card holding structures may be coupled to one another in a modular fashion. This modularity is particularly suitable when the card holding structures are the same size as one another, but is not limited to this circumstance. Multiple card holding structures may be packed together in a two-dimensional or three-dimensional array (e.g. back to back, side to side, front to back and/or top to bottom). Cover 108 may be provided with a flat profile to allow card holding structures to be mounted on top of one another. If bays 114 are sufficiently wide that there is space between the fin backplate 130 of one bay 114 and the fin front-plate 116 of an adjacent bay 114, the card holding structures of the present invention may be stacked such that their fin front-plates 116 interleave with one another to provide even greater packing density.

Chassis 102 of structure 100 may be fabricated from a wide variety of materials, including heat conducting metals and/or composites, for example. Various parts of chassis 102 may be extruded, deposited, molded, cast and/or machined for example. Preferably, base 104 provides a relatively large amount of material between cards 128 to provide correspondingly large heat dissipation characteristics. Chassis 102 may have a variety of different three-dimensional shapes. In the illustrated embodiment, base 104 and fin front-plates 116 are integral with one another. This integral construction is advantageous because it provides a large amount of structural strength for chassis 102 and a correspondingly large amount of protection for cards 128 and their components. In alternative embodiments, fin front-plates 116 may be separately fabricated and then coupled to base 104 using a thermally-conductive coupling technique, such as welding for example.

The network of conduits 120 described above is used to redistribute heat energy so as to cool cards 128 and their components. In some applications, it may be useful to heat cards 128 and their components or to maintain the temperature of cards 128 and their components. The network of conduits 120 may be used for this purpose.

Cover 108 is an optional feature of the card holding structures of the present invention. In some applications, cover 108 may be used to retain heat which may be radiated from fin front-plates 116 and other parts of chassis 102. Such heat may be used to maintain the operational temperature of the enclosure in which cards 128 are held. In such applications, the network of conduits 120 and the previously described cooling system may be used for temperature control, as discussed above. Such temperature control may involve heating and/or cooling.

Although not specifically discussed above, some heat dissipation may be provided by shaping cover 108 such that it physically contacts the smaller dimensioned surfaces (i.e. the thickness) of the shrouds of cards 128. Heat may escape from the surface of cover 108 by conduction, convection and/or radiation. Thermal conductivity may be improved by applying thermally-conductive material between the contact surfaces of the shrouds of cards 128 and the cover 108.

The description provided above discusses the advantages of cards having standardized shroud sizes. Standardized sized shrouds are not a necessary feature of the invention and card holding structures according to the invention may house different sized cards and may comprise different sized bays for this purpose.

The cards described above incorporate electronic and/or micromachined components. In alternative embodiments of the invention, cards may incorporate optical components, mechanical components, fluid control components and/or hydraulic/pneumatic components.

In addition to or as an alternative to their temperature control function, the above-described network of conduits 120 may form a part of external pneumatic and/or hydraulic systems which may provide any of a variety of functions, such as operating hydraulic motors for example. Cards 128 may optionally be sealed with shrouds that are impervious to fluid leaks and with suitable gasket material or the like in the region of slots 118. Such sealing can protect the connectors of cards 128 such that temperature control fluid (e.g. air or water) can be introduced into the enclosure between chassis 102 and cover 108.

In the above described embodiments, backplane 126 comprises electronic circuitry. This is not a necessary feature of the invention. Backplane 126 may comprise optical, mechanical, magnetic, hydraulic/pneumatic and/or fluid control components. In addition, backplane 126 itself is not necessary to the invention. Cards 128 held in structure 100 may be configured to interact with one another using electrical and/or optical cabling, mechanical connections, conduits for fluid communication and/or pneumatic/hydraulic connections.

In accordance with some embodiments of the invention, fluids are conducted through networks of conduits 120 to cool cards 128 and their components. In some embodiments, the fluids used for this purpose comprise compressed gas. In these embodiments, a vortex chamber may be provided in base 104 in order to provide additional, energy-efficient cooling. For example, commercially available vortex cooling tubes of relatively small size (e.g. 3" long by ½ inch in diameter) are capable of providing a relatively large amount of cooling using relatively low air pressure. It is possible to mount or machine such a vortex chamber within chassis 102.

Shrouds of cards 128 may be provided with components of their own. Similarly, fin front-plates 116 may be provided with components of their own. Components fabricated on the shrouds of cards 128 or fin front-plates 116 may require precision alignment to respective components on cards 128 in order to make contact thereto. Such contact may comprise electrical connections, optical connections, mechanical connections, fluid conduits, hydraulic/pneumatic connections or the like.

Structures according to the invention may comprise thermoelectric cooling or heating devices which may be located external to the structure or which may be located within the network of conduits 120. Such thermo-electric cooling and heating devices are capable of absorbing, generating and redistributing heat to cool and/or heat their surrounding environment. In order to decrease the thermal impedance between the gas or fluid and the network of conduits 120, a smaller extruded radial heat sink rod may be press fit into one or more of conduits 120.

The card holding structures of the invention may comprise cantilever type, electrically-conductive ground fingers in a vicinity of slots 118 for electrically coupling the shrouds of cards 128 to a chassis ground on base 104. Such ground fingers may be deformed by the insertion of cards 128 through their respective slots 118 and may exert elastic pressure on the shrouds of their respective cards 128 to form the chassis ground contact. In addition, backplane 126 may comprise similar ground fin front-plategers, as in the case of the standard Cardbus™ PC Card connector, so that the connectors may provide a separate, isolated paths to digital and/or analog grounds. In some embodiments, such analog and/or digital grounds may be electrically connected to the chassis ground.

If base 104 (or other parts of chassis 102) are fabricated to acceptable tolerances, then mating surfaces of chassis 102 can form a part of other similarly fabricated systems. Such mating surfaces may provide interaction in the form of fluid transfer, heat flow, optical connection, electronic connections and micromachined connections and general mechanical connections. Mating surfaces may be suitably sealed with o-rings and gaskets, etc. depending upon system requirements. Such mating surfaces may reduce or eliminate the need for cables which are currently used for some connections to external systems. The provision of such mating surfaces may improve the sealing characteristics of the enclosure formed by cover 108 and chassis 102, because cabling ports may not be required.

Accordingly, the scope of the invention is to be construed in accordance with the substance defined by the following claims.

What is claimed is:

1. A structure for housing cards which incorporate electronic components, the structure comprising:
   a thermally-conductive base that defines a plurality of slots which extend from a first side of the base to a second side of the base;
   a plurality of thermally-conductive fin front-plates in thermal contact with, and extending away from, the first side of the base, each of fin front-plates located adjacent to a corresponding one of the slots;
   one or more cooling fluid conduits located in the base for conducting cooling fluid in the base;
   wherein, the structure defines a plurality of bays, each bay dimensioned to hold a card with the card extending from the first side of the base through a corresponding one of the slots for operable connection to a backplane located on the second side of the base and with a front surface of a shroud of the card in thermal contact with a contact surface of a corresponding one of the fin front-plates to provide a thermal conduction path from the shroud to the fin front-plate and from the fin front-plate to the base.

2. A structure according to claim 1 wherein, for each card held in the structure, the front surface of the shroud is substantially flat.

3. A structure according to claim 1 wherein, for each card held in the structure, the front surface of the shroud is one of two largest area surfaces of the shroud.

4. A structure according to claim 1 wherein, for each card held in the structure, a contact area between the contact surface of the fin front-plate and the front surface of the shroud represents at least 50% of the area of the shroud front surface.

5. A structure according to claim 1 comprising, for each card held in the structure, a thermally-conductive fin back-plate located to receive a portion of the card between the fin front-plate and the fin back-plate, the fin back-plate releasably coupled to the fin front-plate for clamping the card between the fin front-plate and the fin back-plate.

6. A structure according to claim 5 wherein each fin back-plate comprises a back contact surface which abuts against a back surface of the shroud of its corresponding card to provide a thermal conduction path from the shroud to the fin back-plate.

7. A structure according to claim 6 wherein each fin back plate is in thermal contact with the first side of the base to provide a thermal conduction path from the fin back-plate to the base.

8. A structure according to claim 6 wherein, for each card held in the structure, a contact area between the contact surface of the fin back-plate and the back surface of the shroud represents at least 50% of the area of the shroud back surface.

9. A structure according to claim 1 wherein the fin front-plates are parallel with one another.

10. A structure according to claim 1 wherein the fin front plates are integrally formed with the base in a single monolithic unit.

11. A structure according to claim 1 wherein, for each card held in the structure, a ratio of a contact area between the contact surface of the fin front-plate and the front surface of the shroud to power consumption of the card is less than 625 mm$^2$/W.

12. A structure according to claim 1 wherein each fin front plate comprises a plurality of heat sink fins on a side opposite its contact surface for dissipating heat from the fin front plate into a surrounding environment.

13. A structure according to claim 1 comprising a pump for moving cooling fluid through the one or more cooling fluid conduits.

14. A structure according to claim 13 comprising an external cooling system which receives codling fluid from an egress port in the base, removes heat energy from the cooling fluid and outputs the cooling fluid to an ingress port in the box.

15. A structure according to claim 14 which comprises one or more temperature sensors for detecting a temperature of cards held in the structure and for providing one or more corresponding output signals correlated to the temperature of cards held in the structure, wherein the one or more temperature sensors are located on or adjacent to one or more corresponding fin front-plates.

16. A structure according to claim 15 comprising a controller configured to receive the one or more output signals from the one or more temperature sensors and, based on the one or more output signals, to controllably operate an actuator to regulate the temperature of the cards held in the structure, wherein the actuator comprises at least one of: the pump; the external cooling system; and a valve for regulating a pressure or flow rate of the cooling fluid.

17. A structure according to claim 1 wherein each fin front-plate comprises one or more front fin conduits having conduit walls in contact with the fin front-plate, the one or more front fin conduits in fluid communication with the one or more cooling fluid conduits in the base.

18. A structure according to claim 17 wherein the conduit walls of the one or more front fin conduits are in contact with an external surface of the fin front-plate.

19. A structure according to claim 17 wherein the one or more front fin conduits are located in an interior of the fin front plate and the conduit walls of the one or more front fin conduits are in contact with internal surfaces of the fin front-plate.

20. A structure according to claim 5 wherein each fin front-plate comprises one or more front fin conduits having conduit walls in contact with the fin front-plate, the one or more front fin conduits in fluid communication with the one or more cooling fluid conduits in the base.

21. A structure according to claim 20 wherein each fin back-plate comprises one or more back fin conduits having conduit walls in contact with the fin back-plate, the one or more back fin conduits in fluid communication with the one or more cooling fluid conduits in the base.

22. A structure according to claim 21 wherein the conduit walls of the one or more front fin conduits are in contact with an external surface of the fin front-plate.

23. A structure according to claim 21 wherein the one or more front fin conduits are located in an interior of the fin front plate and the conduit walls of the one or more front fin conduits are in contact with internal surfaces of the fin front-plate.

24. A structure according to claim 21 wherein the conduit walls of the one or more back fin conduits are in contact with an external surface of the fin back-plate.

25. A structure according to claim 21 wherein, the one or more back fin conduits are located in an interior of the fin back plate and the conduit walls of the one or more back fin conduits are in contact with internal surfaces of the fin back-plate.

26. A structure according to claim 1 comprising a bottom plate that is coupleable to the base to enclose the backplane in a cavity.

27. A structure according to claim 1 comprising a cover that extends over the first side of the base, over the fin front plates and over the cards held in the structure.

28. A structure according to claim 27 wherein the cover is fabricated from one of: metal and plastic.

29. A structure according to claim 27 wherein the cover is sealed to the base, the seal between the cover and the base preventing leakage of fluid through a joint between the cover and the base.

30. A structure for housing cards which incorporate electronic components, the structure comprising:
   a thermally-conductive base that defines a plurality of slots which extend from a first side of the base to a second side of the base;
   one or more cooling fluid conduits located in the base for conducting cooling fluid in the base;
   a plurality of fin front-plates that extend from the first side of the base in a direction away from the first side of the base, each of fin front-plates located adjacent to a corresponding one of the slots; and
   for each fin front plate, one or more front fin conduits having conduit walls in contact with the fin front-plate and in fluid communication with the one or more cooling fluid conduits in the base;
   wherein, the structure defines a plurality of bays, each bay dimensioned to hold a card with the card extending from the first side of the base through a corresponding one of the slots for operable connection to a backplane located on the second side of the base and with a front surface of a shroud of the card in thermal contact with a contact surface of a corresponding one of the fin front-plates.

31. A structure according to claim 30 wherein each of the fin front plates is in direct thermal contact with the base.

32. A structure according to claim 30 wherein, for each card held in the structure, a contact area between the contact surface of the fin front-plate and the front surface of the shroud represents at least 50% of the area of the shroud front surface.

33. A structure according to claim 30 comprising, for each card held in the structure, a thermally-conductive fin back-plate located to receive a portion of the card between the fin front-plate and the fin back-plate, the fin back -plate releasably coupled to the fin front-plate for clamping the card between the fin front-plate and the fin back-plate.

34. A structure according to claim 33 wherein each fin back-plate comprises a back contact surface which abuts against a back surface of the shroud of its corresponding card to provide a thermal conduction path from the shroud to the fin back-plate.

35. A structure according to claim 34 wherein each fin back plate is in thermal contact with the first side of the base to provide a thermal conduction path from the fin back-plate to the base.

36. A structure according to claim 34 wherein, for each card held in the structure, a contact area between the contact surface of the fin back-plate and the back surface of the shroud represents at least 50% of the area of the shroud back surface.

37. A structure according to claim 30 wherein, for each card held in the structure, a ratio of a contact area between the contact surface of the fin front-plate and the front surface of the shroud to power consumption of the card is less than 625 $mm^2/W$.

38. A structure according to claim 30 comprising a pump for moving cooling fluid through the one or more cooling fluid conduits.

39. A structure according to claim 38 comprising an external cooling system which receives cooling fluid from an egress port in the base, removes heat energy from the cooling fluid and outputs the cooling fluid to an ingress port in the base.

40. A structure according to claim 39 which comprises one or more temperature sensors for detecting a temperature of cards held in the structure and for providing one or more corresponding output signals correlated to the temperature of cards held in the structure, wherein the one or more temperature sensors are located on or adjacent to one or more corresponding fin front-plates.

41. A structure according to claim 40 comprising a controller configured to receive the one or more output signals from the one or more temperature sensors and, based on the one or more output signals, to controllably operate an actuator to regulate the temperature of the cards held in the structure, wherein the actuator comprises at least one of: the pump; the external cooling system; and a valve for regulating a pressure or flow rate of the cooling fluid.

42. A structure according to claim 30 wherein the conduit walls of the one or more front fin conduits are in contact with an external surface of the fin front-plate.

43. A structure according to claim 30 wherein the one or more front fin conduits are located in an interior of the fin front plate and the conduit walls of the one or more front fin conduits are in contact with internal surfaces of the fin front-plate.

44. A structure according to claim 33 wherein each fin back-plate comprises one or more back fin conduits having conduit walls in contact with the fin back-plate, the one or more back fin conduits in fluid communication with the one or more cooling fluid conduits in the base.

45. A structure according to claim 30 comprising a bottom plate that is coupleable to the base to enclose the backplane in a cavity.

* * * * *